(12) United States Patent
Ye

(10) Patent No.: US 12,354,954 B2
(45) Date of Patent: Jul. 8, 2025

(54) INDUCTOR DEVICE WIRING ARCHITECTURE, INTEGRATED CIRCUIT, AND COMMUNICATIONS DEVICE

(71) Applicant: HUAWEI TECHNOLOGIES CO., LTD., Guangdong (CN)

(72) Inventor: Hui Ye, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 855 days.

(21) Appl. No.: 17/489,649

(22) Filed: Sep. 29, 2021

(65) Prior Publication Data

US 2022/0020689 A1 Jan. 20, 2022

Related U.S. Application Data

(63) Continuation of application No. PCT/CN2019/080664, filed on Mar. 29, 2019.

(51) Int. Cl.
| | | |
|---|---|---|
| H01L 23/528 | (2006.01) | |
| H01L 23/522 | (2006.01) | |
| H10D 1/20 | (2025.01) | |

(52) U.S. Cl.
CPC ...... *H01L 23/5283* (2013.01); *H01L 23/5226* (2013.01); *H01L 23/5227* (2013.01); *H10D 1/20* (2025.01)

(58) Field of Classification Search
CPC .............. H01L 23/5283; H01L 23/5226; H01L 23/5227; H01L 28/10; H01L 23/528; H01F 2017/0046; H01F 17/0006; H01F 2017/008

See application file for complete search history.

(56) References Cited

U.S. PATENT DOCUMENTS

| | | |
|---|---|---|
| 2002/0036335 A1 | 3/2002 | Minami |
| 2002/0190382 A1 | 12/2002 | Kouno et al. |
| 2008/0272495 A1* | 11/2008 | Nakashiba ............ H01L 23/585 257/773 |
| 2009/0096061 A1 | 4/2009 | Uchida |
| 2010/0320611 A1 | 12/2010 | Uchida et al. |
| 2018/0047667 A1 | 2/2018 | Uchida et al. |
| 2019/0393148 A1 | 12/2019 | Uchida et al. |
| 2021/0159163 A1 | 5/2021 | Liff et al. |

FOREIGN PATENT DOCUMENTS

| | | |
|---|---|---|
| CN | 102270625 A * | 12/2011 |
| CN | 102487056 A | 6/2012 |
| CN | 203895446 U | 10/2014 |
| WO | 2011135641 A1 | 11/2011 |
| WO | 2018052579 A1 | 3/2018 |

* cited by examiner

*Primary Examiner* — Douglas W Owens

(57) ABSTRACT

Embodiments of this application disclose an inductor device wiring architecture, including an inductor device and a plurality of dummy metals located under the inductor device. The plurality of dummy metals are arranged in a plurality of metal layers. Each of the plurality of metal layers corresponds to some of the plurality of dummy metals. Arrangement areas of dummy metals corresponding to at least two of the plurality of metal layers progressively increase in a direction away from the inductor device. In the inductor device wiring architecture, adverse effects on performance of the inductor device can be reduced, and a product yield can be increased. The embodiments of this application further disclose an integrated circuit and a communications device.

13 Claims, 12 Drawing Sheets

INDUCTOR DEVICE WIRING ARCHITECTURE, INTEGRATED CIRCUIT, AND COMMUNICATIONS DEVICE

CROSS-REFERENCE TO RELATED APPLICATIONS

This application is a continuation of International Application No. PCT/CN2019/080664, filed on Mar. 29, 2019, the disclosure of which is hereby incorporated by reference in its entirety.

TECHNICAL FIELD

This application relates to the field of integrated circuit technologies, and in particular, to an inductor device wiring architecture, an integrated circuit, and a communications device.

BACKGROUND

With rapid development of wireless communications technologies, a radio frequency integrated circuit (RFIC) becomes increasingly important. The radio frequency integrated circuit may be an integrated circuit operating within a frequency range of 300 megahertz (MHz) to 300 gigahertz (GHz). With arrival of latest fifth-generation mobile communications, a signal frequency greatly increases. This brings faster communication experience to people, and also brings greater challenges and opportunities to the radio frequency integrated circuit.

In the integrated circuit, a plurality of layers of electronic components are connected through metal wires to form a complete logic circuit. Based on a chemical mechanical polishing (CMP) process, a molding quality of each layer of metal wire in the integrated circuit is closely related to a metal arrangement area of a bottom metal layer of the metal wire. If the metal arrangement area of the bottom metal layer of the metal wire is insufficient, a yield of the metal wire is poor, and a line is likely to be short-circuited.

To resolve this problem, a common practice is to add a dummy metal to a bottom metal of the metal wire to increase the metal arrangement area. However, when the metal wire serves as an inductor device, the dummy metal under the inductor device affects performance of the inductor device, thereby resulting in poor performance of the inductor device.

SUMMARY

Embodiments of this application provide an inductor device wiring architecture, an integrated circuit, and a communications device. In the inductor device wiring architecture, adverse effects on performance of an inductor device can be reduced, and a product yield can be increased.

According to a first aspect, an embodiment of this application provides an inductor device wiring architecture. The inductor device wiring architecture may be applied to an integrated circuit. The inductor device wiring architecture includes an inductor device and a plurality of dummy metals located under the inductor device. The plurality of dummy metals are arranged in a plurality of metal layers. Each of the plurality of metal layers corresponds to some of the plurality of dummy metals. Arrangement areas of dummy metals corresponding to at least two of the plurality of metal layers progressively increase in a direction away from the inductor device. In other words, arrangement areas of dummy metals corresponding to at least two metal layers located under the inductor device progressively increase.

In this embodiment, the arrangement areas of the dummy metals corresponding to the at least two of the plurality of metal layers under the inductor device progressively increase in the direction away from the inductor device. In this case, an arrangement area of dummy metals corresponding to a metal layer close to the inductor device is smaller, and an arrangement area of dummy metals corresponding to a metal layer away from the inductor device is larger. To be specific, during arrangement, the plurality of dummy metals located under the inductor device are kept away from the inductor device as far as possible, fewer dummy metals are in a region close to the inductor device, and more dummy metals are in a region away from the inductor device, thereby reducing adverse effects of the dummy metals on performance of the inductor device, or even eliminating impact on performance of the inductor device. In addition, each metal layer under the inductor device has a relatively sufficient metal arrangement area. This can meet a processing requirement of chemical mechanical polishing, thereby improving processing quality, and achieving a higher product yield of the inductor device wiring architecture and the integrated circuit in which the inductor device wiring architecture is used.

In an optional embodiment, a space under the inductor device includes a space in which a wiring region of the inductor device is projected along a vertical direction of a metal layer in which the inductor device is located. The wiring region of the inductor device includes at least a region surrounded by an outer edge of an outermost wire of the inductor device.

In an optional embodiment, the plurality of dummy metals are arranged in a stepped shape. To be specific, in the plurality of metal layers under the inductor device, a dummy metal corresponding to a lower metal layer extends out relative to a dummy metal corresponding to an upper metal layer to form a stepped shape.

In this embodiment, because the plurality of dummy metals under the inductor device are arranged in the stepped shape, the plurality of dummy metals can effectively improve metal arrangement under the inductor device, so that higher manufacturing precision of the inductor device is high during chemical mechanical polishing, and a product yield of the inductor device wiring architecture and the integrated circuit in which the inductor device wiring architecture is used is higher. In addition, the plurality of dummy metals can be arranged not in a region close to the inductor device, but arranged in a region away from the inductor device as far as possible, thereby reducing adverse effects of the dummy metals on performance of the inductor device, and improving performance of the inductor device.

The inductor device wiring architecture may further include a plurality of dummy metals arranged in a same layer as that of the inductor device. Some dummy metals arranged in the same layer as that of the inductor device may be jointly arranged in a stepped shape with the plurality of dummy metals located under the inductor device. In this case, the dummy metals arranged in the same layer as that of the inductor device have less impact on performance of the inductor device, processing quality of the inductor device is higher, and a product yield of the inductor device wiring architecture is higher.

In an optional embodiment, in the plurality of metal layers, arrangement areas of dummy metals corresponding to at least three adjacent metal layers progressively increase in a direction away from the inductor device. In this case, the plurality of dummy metals under the inductor device present a continuous stepped shape. This helps further improve processing quality of the inductor device wiring architecture, and the plurality of dummy metals have less impact on performance of the inductor device.

In an optional embodiment, an arrangement area of dummy metals corresponding to an $i^{th}$ metal layer under the inductor device is the same as an arrangement area of dummy metals corresponding to an $(i-1)^{th}$ metal layer, the $i^{th}$ metal layer is located on a side, of the $(i-1)^{th}$ metal layer, that is away from the inductor device, and i is an integer greater than or equal to 2.

In this embodiment, when the inductor device wiring architecture roughly meets an arrangement rule of transitioning from a sparse arrangement to a dense arrangement, two metal layers corresponding to dummy metals with a same arrangement area are included under the inductor device, so that arrangement flexibility of the plurality of dummy metals in the inductor device wiring architecture is higher, and arrangement manners are more diversified.

The inductor device wiring architecture may include one group of two metal layers corresponding to dummy metals with a same arrangement area, or may include more than two (including two) groups of two metal layers corresponding to dummy metals with a same arrangement area. Alternatively, the inductor device wiring architecture may include more than three (including three) metal layers corresponding to dummy metals with a same arrangement area.

In an optional embodiment, a plurality of dummy metals corresponding to the $i^{th}$ metal layer are arranged at equal spacings, and an arrangement spacing between two adjacent dummy metals is an $i^{th}$ spacing; a plurality of dummy metals corresponding to the $(i-1)^{th}$ metal layer are arranged at equal spacings, and an arrangement spacing between two adjacent dummy metals is an $(i-1)^{th}$ spacing; and the $(i-1)^{th}$ spacing is less than the $i^{th}$ spacing. In this case, although metal arrangement areas of the $i^{th}$ metal layer do not progressively increase, the plurality of dummy metals corresponding to the $i^{th}$ metal layer have a larger arrangement range and a more uniform arrangement. This effectively improves processing quality of the metal layer, and achieves a higher product yield of the inductor device wiring architecture.

In an optional embodiment, an arrangement area of dummy metals corresponding to a $j^{th}$ metal layer under the inductor device is smaller than an arrangement area of dummy metals corresponding to a $(j-1)^{th}$ metal layer, the $j^{th}$ metal layer is located on a side, of the $(j-1)^{th}$ metal layer, that is away from the inductor device, and j is an integer greater than or equal to 2.

In this implementation, when the inductor device wiring architecture roughly meets an arrangement rule of transitioning from a sparse arrangement to a dense arrangement, two metal layers corresponding to dummy metals are included under the inductor device, where an arrangement area of an upper metal layer is smaller than an arrangement area of a lower metal layer, so that arrangement flexibility of the plurality of dummy metals in the inductor device wiring architecture is higher, and arrangement manners are more diversified.

The inductor device wiring architecture may include one group of two metal layers corresponding to dummy metals, or may include more than two (including two) groups of two metal layers corresponding to dummy metals, where an arrangement area of an upper metal layer is smaller than an arrangement area of a lower metal layer. Alternatively, the inductor device wiring architecture may include more than three (including three) metal layers corresponding to dummy metals, where an arrangement area of an upper metal layer is smaller than an arrangement area of a lower metal layer.

In an optional embodiment, a plurality of dummy metals corresponding to the $j^{th}$ metal layer are arranged at equal spacings, and an arrangement spacing between two adjacent dummy metals is a $j^{th}$ spacing; a plurality of dummy metals corresponding to the $(j-1)^{th}$ metal layer are arranged at equal spacings, and an arrangement spacing between two adjacent dummy metals is a $(j-1)^{th}$ spacing; and the $(j-1)^{th}$ spacing is less than the $j^{th}$ spacing. In this case, the plurality of dummy metals corresponding to the $j^{th}$ metal layer with a smaller metal arrangement area have a larger arrangement range and a more uniform arrangement. This effectively improves processing quality of the metal layer, and achieves a higher product yield of the inductor device wiring architecture.

In an optional embodiment, under the inductor device, each metal layer (a metal layer of the plurality of metal layers) corresponds to a plurality of dummy metals, and dummy metals corresponding to each metal layer are arranged in a staggered manner with dummy metals corresponding to an adjacent metal layer. In this case, the plurality of dummy metals under the inductor device are arranged more regularly, thereby helping reduce design costs and production costs of the inductor device wiring architecture.

In an optional embodiment, under the inductor device, each metal layer (a metal layer of the plurality of metal layers) has a plurality of dummy metals, and dummy metals corresponding to each metal layer are arranged in alignment with dummy metals corresponding to an adjacent metal layer. In this case, the plurality of dummy metals under the inductor device are arranged more regularly, thereby helping reduce design costs and production costs of the inductor device wiring architecture.

In an optional embodiment, under the inductor device, each metal layer (a metal layer of the plurality of metal layers) corresponds to a plurality of dummy metals, dummy metals corresponding to one or more metal layers are arranged in a staggered manner with dummy metals corresponding to an adjacent metal layer, and dummy metals corresponding to one or more metal layers are arranged in alignment with dummy metals corresponding to an adjacent metal layer.

In this case, under the inductor device in the inductor device wiring architecture, some dummy metals are arranged in alignment, and some dummy metals are arranged in a staggered manner. This enriches arrangement manners of the plurality of dummy metals, and makes arrangement manners of the inductor device wiring architecture more diversified.

In an optional embodiment, the inductor device is an inductor with two ports or a transformer with four ports. The inductor with two ports includes but is not limited to a helical inductor, a differential inductor, and the like. In this application, the inductor device may have a plurality of implementation structures, and the inductor device wiring architecture has a wider application scope.

In an optional embodiment, the inductor device is arranged in one metal layer; or the inductor device includes an upper inductor and a lower inductor, and the upper inductor and the lower inductor are arranged in two adjacent metal layers. The upper inductor and the lower inductor may be connected by using a conductive material, so that the inductor device serves as a multilayer metal serial inductor. In this application, the inductor device may have a plurality of implementation structures, and the inductor device wiring architecture has a wider application scope.

According to a second aspect, an embodiment of this application further provides an integrated circuit, including the inductor device wiring architecture according to any one of the foregoing implementations. Because the inductor device wiring architecture has lower costs and has a little adverse effect on performance of an inductor device, the integrated circuit has low costs and high performance.

According to a third aspect, an embodiment of this application further provides a communications device, including the foregoing integrated circuit.

DESCRIPTION OF EMBODIMENTS

The following describes the embodiments of this application with reference to the accompanying drawings in the embodiments of this application.

An embodiment of this application provides a communications device. The communications device may be a wireless fidelity (Wi-Fi) device, a Bluetooth (bluetooth) device, an infrared device, a global positioning system (GPS) device, a near-field communication (NFC) device, a mobile communications device, a router, a photoelectric device, a base station, a microwave device, or the like.

The communications device includes an integrated circuit (IC). For example, the communications device includes a high frequency integrated circuit (HFIC). The high frequency integrated circuit is an integrated circuit whose operating frequency is greater than 100 megahertz (MHz). For example, the high frequency integrated circuit may be a radio frequency integrated circuit (RFIC). The radio frequency integrated circuit may operate within a range of 300 megahertz to 300 gigahertz (GHz) to implement a specific radio frequency function.

In an embodiment, the integrated circuit includes an inductor device wiring architecture. The inductor device wiring architecture includes an inductor device. The inductor device is one of most important devices of the integrated circuit. The inductor device is connected to devices such as a resistor, a capacitor, a metal-oxide-semiconductor field-effect transistor (MOSFET), a bipolar junction transistor (BJT), and/or a diode by using a special circuit structure to jointly form the integrated circuit. The integrated circuit has functions of control, calculation, memorization, and the like.

The integrated circuit may include one or more circuit modules. The circuit module may include but is not limited to one or more of a voltage control oscillator (VCO) module, a low-noise amplifier (LNA) module, a frequency mixer module, a trans-impedance amplifier (TIA) module, a variable gain amplifier (VGA) module, or a driver module. Inductor devices are widely used in these circuit modules.

Figure 1:
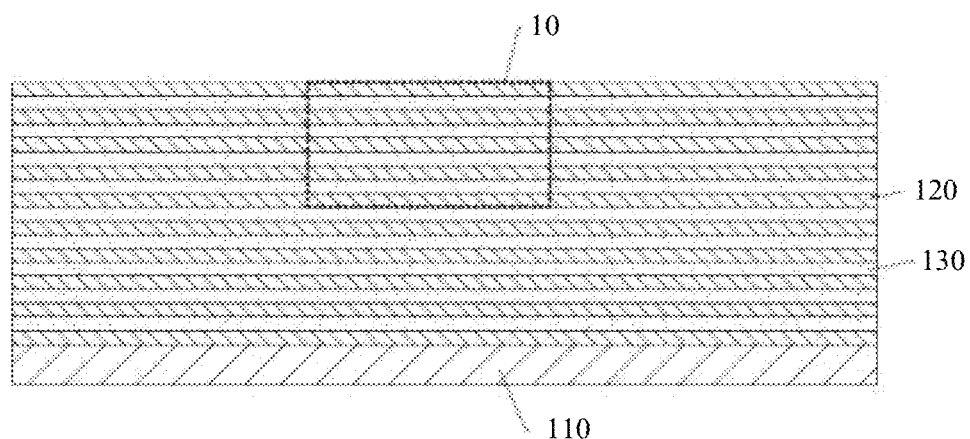
FIG. 1 is a diagram of an integrated circuit according to an embodiment of this application.

FIG. 1 is a diagram of an integrated circuit 100 according to an embodiment of this application.

In an embodiment, the integrated circuit 100 includes a substrate 110, and a plurality of metal layers 120 and a plurality of insulation layers 130 that are formed on the substrate 110. At least one insulation layer 130 is disposed between any two adjacent metal layers 120. A silicon material, a glass material, or a ceramic material may be used for the substrate 110. A material of the metal layer 120 may include one or more of copper, aluminum, silver, nickel, gold, titanium, indium, tungsten, or an alloy thereof. A material of the insulation layer 130 may include one or more of an electrical-insulating polymer, electrical-insulating ceramic, or a dielectric material.

The metal layer 120 is a patterned metal layer. The patterned metal layer may be molded in a plurality of manners. Examples are as follows.

In an implementation, a method for manufacturing the patterned metal layer includes: first, forming a groove on an insulation substrate based on a layout of the patterned metal layer; then, performing metal deposition (metal deposition) on the insulation substrate, so that a metallic material fills the groove and spills out of the groove; and next, removing, through chemical mechanical polishing (chemical-mechanical polishing, CMP), a metallic material spilled out of the groove. In this case, a metallic material remaining in the groove jointly forms the patterned metal layer.

In another implementation, a method for manufacturing the patterned metal layer includes: first, performing deposition to form a metal film; then, depositing photoresistance on the metal film; next, performing exposure, photolithography (photolithography), and etching (etching) processing by using a mask (mask) to pattern the metal film; and finally, performing planarization processing on a patterned metal film to form the patterned metal layer. The planarization processing is usually performed through chemical mechanical polishing.

Therefore, in the molding steps of the patterned metal layer, the chemical mechanical polishing processing usually needs to be performed in the last step. However, a completion degree of the chemical mechanical polishing processing usually depends on a metal arrangement area of a to-be-processed metal layer and a metal arrangement area of a bottom metal layer of the to-be-processed metal layer. If the metal arrangement area is insufficient, a phenomenon of insufficient polishing is likely to occur, thereby resulting in a very low product yield of the patterned metal layer.

In an embodiment, the integrated circuit 100 includes an inductor device wiring architecture 10. The inductor device wiring architecture 10 is a part of the integrated circuit 100. The inductor device wiring architecture 10 includes some metal layers 120 and some insulation layers 130. The inductor device wiring architecture 10 is molded synchronously with other parts of the integrated circuit 100 during manufacturing of the integrated circuit 100. A specific quantity of layers of the inductor device wiring architecture 10 may be less than or equal to a quantity of layers of the integrated circuit 100.

In an embodiment, the inductor device wiring architecture 10 includes an inductor device and a plurality of dummy metals (dummy metals) located under the inductor device. A plurality of metal layers may be laminated in the inductor device wiring architecture 10. The metal layers of the inductor device wiring architecture 10 are some of the corresponding metal layers 120, and the metal layers of the inductor device wiring architecture 10 are also patterned metal layers. The inductor device is arranged in a top metal layer of the inductor device wiring architecture 10. The plurality of dummy metals under the inductor device are arranged in a plurality of metal layers under the inductor device. Each of the plurality of metal layers located under the inductor device corresponds to some of the plurality of dummy metals located under the inductor device. Arrangement areas of dummy metals corresponding to at least two of the plurality of metal layers under the inductor device progressively increase in a direction away from the inductor device. In this case, an arrangement area of dummy metals corresponding to a metal layer close to the inductor device is smaller, and an arrangement area of dummy metals corresponding to a metal layer away from the inductor device is larger. To be specific, during arrangement, the plurality of dummy metals located under the inductor device are kept away from (keep put from) the inductor device as far as possible, fewer dummy metals are in a region close to the inductor device, and more dummy metals are in a region away from the inductor device, thereby reducing adverse effects of the dummy metals on performance of the inductor device, or even eliminating impact on performance of the inductor device. In addition, each metal layer under the inductor device has a relatively sufficient metal arrangement area. This can meet a processing requirement of chemical mechanical polishing, thereby improving processing quality, and achieving a higher product yield of the inductor device wiring architecture 10 and the integrated circuit in which the inductor device wiring architecture 10 is used.

The following provides descriptions by using specific embodiments.

Figure 2:
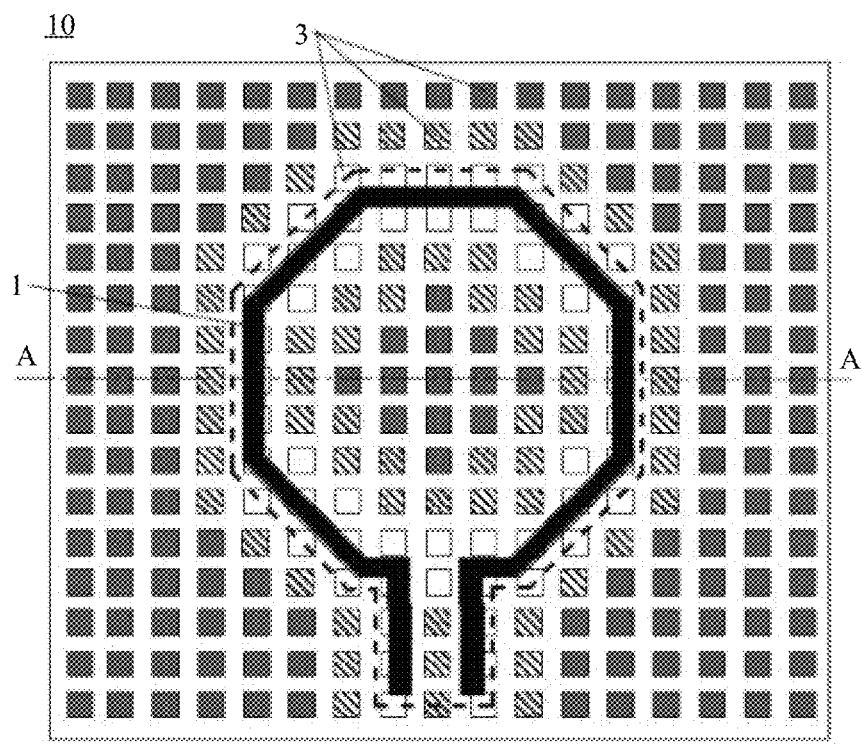
FIG. 2 is a top view of an inductor device wiring architecture shown in FIG. 1 according to a first embodiment.
Figure 3:
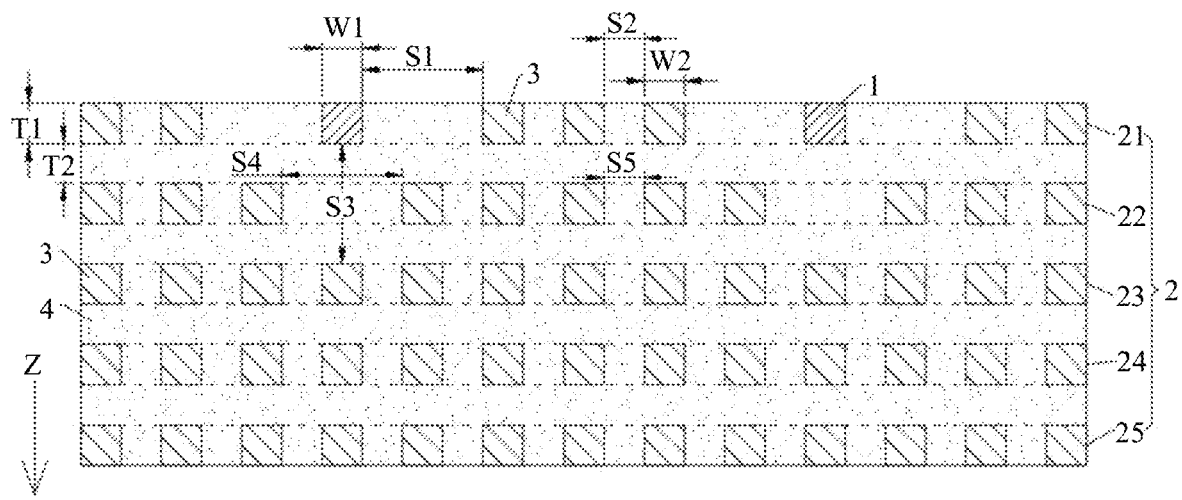
FIG. 3 is a cross-sectional view of a partial structure of an inductor device wiring architecture shown in FIG. 2 that is cut along a line A-A.

Refer to both FIG. 2 and FIG. 3. FIG. 2 is a top view of the inductor device wiring architecture 10 shown in FIG. 1 according to a first embodiment, and FIG. 3 is a cross-sectional view of a partial structure of the inductor device wiring architecture 10 shown in FIG. 2 that is cut along a section line A-A. To illustrate the structure in FIG. 3 more clearly, a quantity of dummy metals 3 in each metal layer 2 in FIG. 3 is slightly reduced, but an overall arrangement rule remains unchanged.

The inductor device wiring architecture 10 includes an inductor device 1 and a plurality of dummy metals 3 located under the inductor device 1. In this application, "under" is merely a direction shown with reference to the accompanying drawings. Therefore, a directional term is used for describing and understanding this application, but not to indicate or imply that an indicated apparatus or element shall have a specific direction or be constructed and operated in a specific direction, and therefore cannot be construed as a limitation on this application. For example, in the integrated circuit 100 in both FIG. 1 and FIG. 3, the inductor device 1 may be arranged in a top metal layer 120 of the integrated circuit 100. A space under the inductor device 1 is a space on a side, of the inductor device 1, that faces the substrate 110 of the integrated circuit 100. To be specific, a structure or a component located under the inductor device 1 is located between the inductor device 1 and the substrate 110.

The space under the inductor device 1 includes a space under a wiring region of the inductor device 1 (as indicated by a dashed-line box on a periphery of the inductor device 1 in FIG. 2). To be specific, the space under the inductor device 1 includes a space in which the wiring region of the inductor device 1 is projected along a vertical direction of a plane on which the inductor device 1 is located. The wiring region of the inductor device 1 covers the entire inductor device 1. The wiring region of the inductor device 1 includes at least a region surrounded by an outer edge of an outermost wire of the inductor device 1. In actual use, the "vertical direction" described above is not limited to a direction that has an included angle of exactly 90° with the plane on which the inductor device 1 is located, but may be alternatively a direction close to 90°. The plurality of dummy metals 3 under the inductor device 1 are located in the space under the inductor device 1.

The inductor device wiring architecture 10 includes a plurality of laminated metal layers 2 (see FIG. 3). The metal layers 2 are some of the corresponding metal layers 120 of the integrated circuit 100. The plurality of dummy metals 3 under the inductor device 1 are arranged in a plurality of metal layers 2 under the inductor device 1. Each of the plurality of metal layers 2 under the inductor device 1 includes a plurality of corresponding dummy metals 3, to increase a metal arrangement area of the metal layer 2. The plurality of metal layers 2 under the inductor device 1 are a bottom structure of the inductor device 1.

In this embodiment, the plurality of dummy metals 3 corresponding to the metal layer 2 under the inductor device 1 are spaced apart from each other. In another embodiment, two or more dummy metals 3 may be alternatively combined into a continuous dummy metal with a larger area. For example, a plurality of discontinuous dummy metals 3 in the embodiment shown in FIG. 2 may be combined into a continuous dummy metal.

Dummy metals 3 located in two adjacent metal layers 2 may be connected by using a conductive material in a via, or may not be connected.

In this embodiment, the inductor device 1 is located in a first metal layer 21. Because the inductor device 1 is disposed in the first metal layer 21, the first metal layer 21 can be processed to obtain a larger thickness, thereby reducing a resistance and increasing a quality factor Q. A second metal layer 22 to a fifth metal layer 25 are arranged under the inductor device 1. The second metal layer 22 to the fifth metal layer 25 are a bottom structure of the inductor device 1. The plurality of dummy metals 3 under the inductor device 1 are arranged in the second metal layer 22, the third metal layer 23, the fourth metal layer 24, and the fifth metal layer 25.

The inductor device wiring architecture 10 further includes a plurality of dummy metals 3 arranged in a metal layer 2 in which the inductor device 1 is located. For example, in this embodiment, the first metal layer 21 further includes a plurality of dummy metals 3, and the plurality of dummy metals 3 are disposed around the inductor device 1 and are disposed away from the inductor device 1. When the inductor device 1 surrounds a middle space with a larger area, a dummy metal 3 may also be arranged in the middle space.

Arrangement areas of dummy metals corresponding to at least two metal layers 2 located under the inductor device 1 progressively increase in a direction away from the inductor device 1 (for example, a Z direction shown in FIG. 3). An arrangement area of dummy metals corresponding to a metal layer 2 is a total arrangement area of dummy metals 3 that are in the metal layer 2 and that are located under the inductor device 1. A metal layer 2 with a larger arrangement area of dummy metals 3 has a larger metal arrangement proportion. In this case, among the plurality of dummy metals 3 located under the inductor device 1, fewer dummy metals 3 are arranged in a region close to the inductor device 1 and more dummy metals 3 are arranged in a region away from the inductor device 1, thereby reducing adverse effects on performance of the inductor device 1. In addition, because arrangement areas of the dummy metals 3 corresponding to the metal layers 2 under the inductor device 1 tend to progressively increase, arrangement areas of the metal layers 2 under the inductor device 1 roughly present a progressively increasing trend based on the arrangement areas of the dummy metals 3 (to be specific, the metal layers 2 roughly present a trend from a sparse arrangement to a dense arrangement from the top down). Therefore, each metal layer 2 of the inductor device wiring architecture 10 has a relatively sufficient metal arrangement area to meet a processing requirement of chemical mechanical polishing, so that the first metal layer 21 is well flattened, and the inductor device 1 has a few metal residues and high processing quality. Therefore, a short circuit risk of a circuit is reduced, and a product yield of the inductor device wiring architecture 10 and the integrated circuit 100 in which the inductor device wiring architecture 10 is used is higher. In short, in the inductor device wiring architecture 10, a metal arrangement area of each metal layer 2 can be increased while adverse effects of the dummy metals 3 on inductor device performance of the inductor device 1 are reduced. This increases a product yield.

The plurality of dummy metals 3 located under the inductor device 1 are arranged in a stepped shape. To be specific, in the plurality of metal layers 2 located under the inductor device 1, a dummy metal 3 corresponding to a lower metal layer 2 extends out relative to a dummy metal 3 corresponding to an upper metal layer 2 to form a stepped shape. For example, in FIG. 3, a dummy metal 3 corresponding to the third metal layer 23 extends out relative to a dummy metal 3 corresponding to the second metal layer 22 to form a stepped shape.

In FIG. 2, dummy metals 3 located in different metal layers 2 in the inductor device wiring architecture 10 are shown filled with different patterns for differentiation. The inductor device 1 and the dummy metal 3 in the first metal layer 21 are filled with a black pattern, the dummy metal 3 in the second metal layer 22 is filled with slashes, and the dummy metal 3 in the third metal layer 23 is not filled with a pattern (that is, has a white background color). In this embodiment, the dummy metals 3 in the plurality of metal layers 2 are arranged in alignment. In this case, a dummy metal 3 in a bottom structure is blocked by a dummy metal 3 in a top structure. For example, some dummy metals 3 in the second metal layer 22 are blocked by dummy metals 3 in the first metal layer 21. Some dummy metals 3 in the second metal layer 22 extend out relative to dummy metals 3 in the first metal layer 21, and the dummy metals 3 that relatively extend out are exposed.

In this embodiment, because the plurality of dummy metals 3 located under the inductor device 1 are arranged in the stepped shape, the plurality of dummy metals 3 can effectively improve metal arrangement under the inductor device 1, so that manufacturing precision of the inductor device 1 is high during chemical mechanical polishing, and a product yield of the inductor device wiring architecture 10 and the integrated circuit 100 in which the inductor device wiring architecture 10 is used is higher. In addition, the plurality of dummy metals 3 located under the inductor device 1 can be arranged not in a region close to the inductor device 1, but arranged in a region away from the inductor device 1 as far as possible, thereby reducing adverse effects of the dummy metals 3 on inductor device performance of the inductor device 1, and improving performance of the inductor device 1.

Some dummy metals 3 arranged in the metal layer 2 in which the inductor device 1 is located and the dummy metals 3 arranged under the inductor device 1 may also be arranged in a stepped shape. For example, in FIG. 3, a dummy metal 3 corresponding to the second metal layer 22 extends out relative to a dummy metal 3 corresponding to the first metal layer 21 to form a stepped shape.

Examples are as follows

As shown in FIG. 3, some of the plurality of dummy metals 3 in the first metal layer 21 are disposed around the inductor device 1, and some of the plurality of dummy metals 3 in the first metal layer 21 are arranged in the middle space surrounded by the inductor device 1. A spacing S1 is formed between the inductor device 1 and a dummy metal 3 closest to the inductor device 1 among the dummy metals 3 located in the middle space of the inductor device 1. A spacing S2 is formed between two adjacent dummy metals 3 located in the middle space of the inductor device 1. S1 is greater than S2. In this case, the dummy metals 3 in the first metal layer 21 have smaller impact on performance of the inductor device 1, and the inductor device 1 has higher inductance performance. Similarly, a spacing between the inductor device 1 and some dummy metals 3 located on a periphery of the inductor device 1 is greater than a spacing between two adjacent dummy metals 3 located on the periphery of the inductor device 1.

In this embodiment, the plurality of dummy metals 3 in the first metal layer 21 may be arranged at equal spacings or unequal spacings. This is not strictly limited in this application. In this application, a "spacing" between two adjacent dummy metals 3 is a spacing between two dummy metals 3 located on a same side of the inductor device 1.

In this embodiment, the dummy metals 3 in the first metal layer 21 are arranged roughly in an array (no dummy metal 3 is arranged in some regions of the array), and spacings between every two adjacent dummy metals 3 are roughly the same. In another embodiment, the dummy metals 3 in the first metal layer 21 may be alternatively arranged in another manner, for example, arranged roughly in a diffused annular shape or randomly arranged in a scattered manner.

A plurality of dummy metals 3 corresponding to the second metal layer 22 are kept away from the inductor device 1 as far as possible. For example, a dummy metal 3 in the second metal layer 22 is arranged not directly under a wire of the inductor device 1, to increase a metal arrangement area of the second metal layer 22 as much as possible, so that a product yield of the inductor device wiring architecture 10 is increased, and there is less impact on performance of the inductor device 1. In the second metal layer 22, a spacing S4 between two dummy metals 3 close to a space directly under a wire of the inductor device 1 is greater than or equal to a gap S5 between two adjacent dummy metals 3.

In this embodiment, some dummy metals 3 corresponding to the second metal layer 22 extend out relative to dummy metals 3 in the first metal layer 21, and a plurality of dummy metals 3 that are in the first metal layer 21 and the second metal layer 22 and that are close to the inductor device 1 are arranged roughly in a stepped shape.

In this embodiment, for designs of a structure and a size of the dummy metal 3 in the second metal layer 22, refer to the dummy metal 3 in the first metal layer 21. For example, S5 is equal to S2. In another embodiment, designs of a structure and a size of the dummy metal 3 in the second metal layer 22 may be alternatively different from those of the dummy metal in the first metal layer 21.

S1 may range from 1 micron ($\mu$m) to 15 microns. S1 may be set based on a range of an electromagnetic field generated by the inductor device 1. S2 may range from 0.1 micron to 10 microns. A width of the wire of the inductor device 1 is W1. W1 may range from 1 micron to 20 microns. A width of the dummy metal 3 is W2. W2 may range from 0.1 micron to 10 microns. In a thickness direction (namely, the Z direction) of the inductor device wiring architecture 10, a thickness of the dummy metal 3 is T1. T1 may range from 0.1 micron to 4 microns. A copper or aluminum material may be used for the dummy metal 3. A copper or aluminum material may be used for the inductor device 1. A material of the inductor device 1 is the same as a material of the dummy metal 3 in the first metal layer 21.

An arrangement area of dummy metals 3 corresponding to the third metal layer 23 is larger than an arrangement area of the dummy metals 3 corresponding to the second metal layer 22. Some dummy metals 3 corresponding to the third metal layer 23 extend out relative to dummy metals 3 corresponding to the second metal layer 22. In this embodiment, a plurality of dummy metals 3 in the first metal layer 21, the second metal layer 22, and the third metal layer 23 are arranged in a stepped shape.

A dummy metal 3 in the third metal layer 23 is located directly under a wire of the inductor device 1, and a spacing between the dummy metal 3 and the wire of the inductor device 1 is S3. S3 may range from 1 micron to 15 microns. S3 may be designed based on a range of an electromagnetic field of the inductor device 1.

For designs of a structure and a size of the dummy metal 3 in the third metal layer 23, refer to the dummy metal 3 in the first metal layer 21. In another embodiment, designs of a structure and a size of the dummy metal 3 in the third metal layer 23 may be alternatively different from those of the dummy metal in the first metal layer 21.

In this embodiment, the inductor device wiring architecture 10 further includes a plurality of dielectric layers 4. The dielectric layers 4 are a part of the corresponding insulation layers 130. A dielectric layer 4 is disposed between every two adjacent metal layers 2. When a gap is formed between dummy metals 3 in a metal layer 2, the gap is filled with an insulation material to form an insulation part. The insulation part is connected to the dielectric layer 4.

The dielectric layers 4 in the inductor device wiring architecture 10 may have a same thickness. For example, as shown in FIG. 3, the thickness of the dielectric layer 4 is T2. T2 may range from 0.1 micron to 4 microns.

As shown in FIG. 2 and FIG. 3, in this embodiment, the plurality of dummy metals 3 under the inductor device 1 are mainly arranged in a stepped shape. In another embodiment, when a processing requirement and a performance requirement are met, the plurality of dummy metals 3 under the inductor device 1 may be alternatively arranged in another manner.

As shown in FIG. 2 and FIG. 3, in this embodiment, the plurality of dummy metals 3 under the inductor device 1 have a roughly same shape and size. In another embodiment, the plurality of dummy metals 3 under the inductor device 1 may alternatively have different shapes and different sizes. Similarly, a plurality of dummy metals 3 disposed in a same layer as that of the inductor device 1 and the plurality of dummy metals 3 under the inductor device 1 may have a roughly same shape and size, or may have different shapes and different sizes.

As shown in FIG. 2, in this embodiment, the plurality of dummy metals 3 under the inductor device 1 are in a square cross-sectional shape. In another embodiment, the plurality of dummy metals 3 under the inductor device 1 may be alternatively in a strip cross-sectional shape, a triangular shape, a circular shape, an elliptical shape, a polygonal shape, a special shape, or the like. A shape and a size of the dummy metal 3 are not strictly limited in this application.

In an embodiment, the inductor device wiring architecture 10 further includes a polycrystalline silicon layer (not shown in the figure) located under the plurality of metal layers 2. The polycrystalline silicon layer includes a plurality of polycrystalline silicon regions that serve as gates of PN junctions (a P-type semiconductor and an N-type semiconductor are fabricated on one semiconductor substrate, and a space charge region referred to as a PN junction, is formed at a junction interface of the semiconductors of the integrated circuit 100. An arrangement of the plurality of polycrystalline silicon regions also needs to meet a processing requirement of chemical mechanical polishing to flatten the plurality of metal layers 2. For an arrangement rule of the plurality of polycrystalline silicon regions, refer to the foregoing arrangement rule of the plurality of dummy metals 3. For example, when the polycrystalline silicon layer is closer to the inductor device 1, the polycrystalline silicon regions in the polycrystalline silicon layer tend to be arranged away from the inductor device 1. Specifically, an arrangement area of the polycrystalline silicon regions in the polycrystalline silicon layer and the arrangement area of the dummy metals 3 corresponding to the metal layers 2 under the inductor device 1 progressively increase in a direction away from the inductor device 1. The plurality of polycrystalline silicon regions and the plurality of dummy metals 3 located under the inductor device 1 may be jointly arranged in a stepped shape.

Further, in this application, when the plurality of dummy metals 3 under the inductor device 1 in the inductor device wiring architecture 10 meet an arrangement rule of transitioning from a sparse arrangement to a dense arrangement in a direction away from the inductor device 1, there may be a plurality of arrangement manners. Examples are as follows.

In an arrangement manner, under the inductor device 1, each metal layer 2 corresponds to a plurality of dummy metals 3, and dummy metals 3 corresponding to each metal layer 2 are arranged in a staggered manner with dummy metals 3 corresponding to an adjacent metal layer 2. In other words, a dummy metal 3 under the inductor device 1 and a dummy metal 3 located above or under the dummy metal 3 have a location relationship of being roughly staggered with each other. In this case, the plurality of dummy metals 3 located under the inductor device 1 are arranged more regularly, thereby helping reduce design costs and production costs.

In another arrangement manner, under the inductor device 1 each metal layer 2 corresponds to a plurality of dummy metals 3, and dummy metals 3 corresponding to each metal layer 2 are arranged in alignment with dummy metals 3 corresponding to an adjacent metal layer 2. In other words, a dummy metal 3 under the inductor device 1 and a dummy metal 3 above or under the dummy metal 3 have a location relationship of roughly facing each other. In this case, the plurality of dummy metals 3 located under the inductor device 1 are arranged more regularly, thereby helping reduce design costs and production costs.

In still another arrangement manner, under the inductor device 1, each metal layer 2 corresponds to a plurality of dummy metals 3, where dummy metals 3 corresponding to one or more metal layers 2 are arranged in a staggered manner with dummy metals 3 corresponding to an adjacent metal layer 2, and dummy metals 3 corresponding to one or more metal layers 2 are arranged in alignment with dummy metals 3 corresponding to an adjacent metal layer 2. In this case, under the inductor device 1 in the inductor device wiring architecture 10, some dummy metals 3 are arranged in alignment, and some dummy metals 3 are arranged in a staggered manner.

This enriches arrangement manners of the dummy metals 3, and makes arrangement manners of the inductor device wiring architecture 10 more diversified.

Details are as follows.

In the first embodiment shown in FIG. 2 and FIG. 3, under the inductor device 1, dummy metals 3 corresponding to each metal layer 2 are arranged in alignment with dummy metals 3 corresponding to an adjacent metal layer 2. For example, dummy metals 3 corresponding to the second metal layer 22 to the fifth metal layer 25 are arranged in alignment. In an embodiment, sizes of the plurality of dummy metals 3 under the inductor device 1 are the same, and spacings between every two adjacent dummy metals 3 corresponding to each metal layer 2 are the same, for example, S5=S2.

Figure 4:
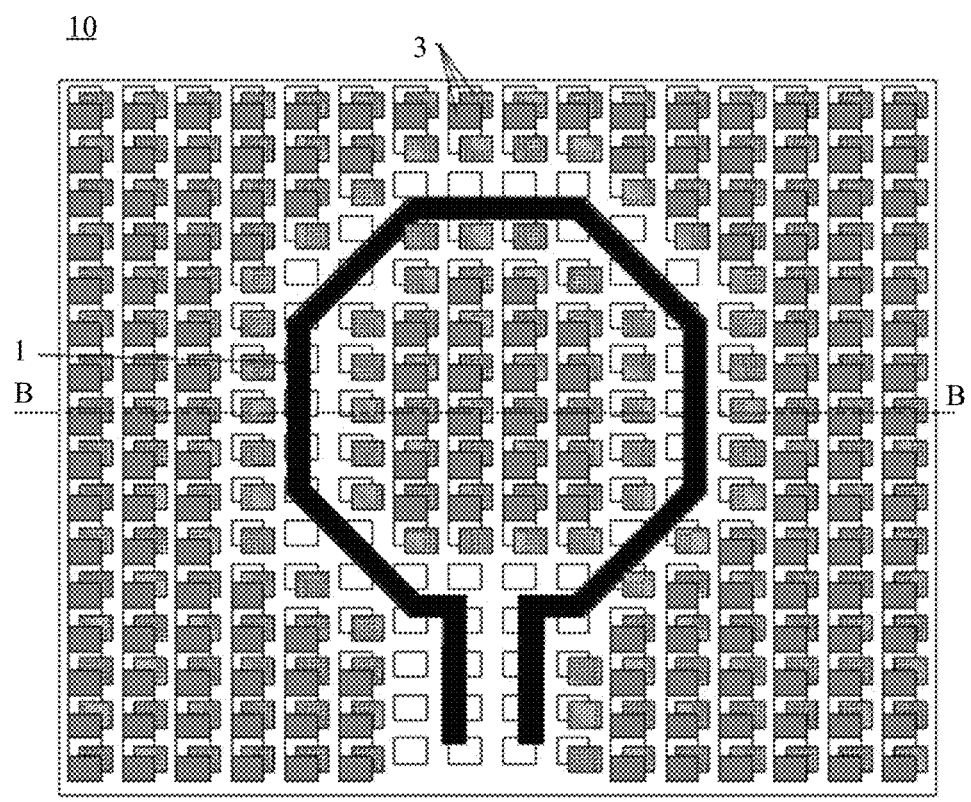
FIG. 4 is a top view of an inductor device wiring architecture shown in FIG. 1 according to a second embodiment.
Figure 5:
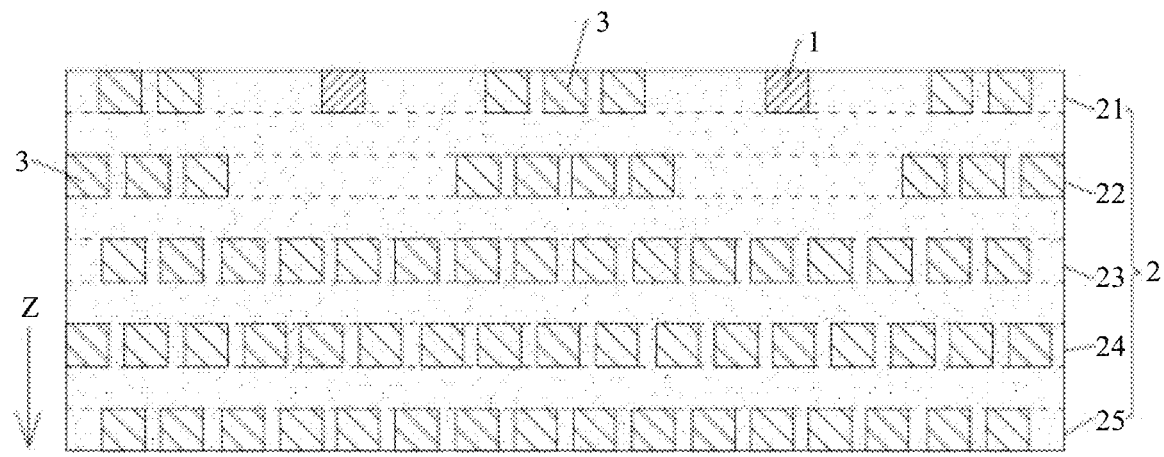
FIG. 5 is a cross-sectional view of a partial structure of an inductor device wiring architecture shown in FIG. 4 that is cut along a line B-B.

Refer to both FIG. 4 and FIG. 5. FIG. 4 is a top view of the inductor device wiring architecture 10 shown in FIG. 1 according to a second embodiment, and FIG. 5 is a cross-sectional view of a partial structure of the inductor device wiring architecture 10 shown in FIG. 4 that is cut along a section line B-B. To illustrate the structure in FIG. 5 more clearly, a quantity of dummy metals 3 in each metal layer 2 in FIG. 5 is slightly reduced, but an overall arrangement rule remains unchanged. Most technical content in this embodiment is the same as that in the foregoing embodiments, and is not described in detail again.

In the second embodiment, under the inductor device 1, dummy metals 3 corresponding to each metal layer 2 are arranged in a staggered manner with dummy metals 3 corresponding to an adjacent metal layer 2. In this case, a layer structure under the inductor device 1 has a more uniform metal arrangement area, thereby helping improve processing precision of the inductor device 1, and achieving a higher product yield of the inductor device wiring architecture 10.

In this embodiment, the inductor device wiring architecture 10 includes a first metal layer 21, a second metal layer 22, a third metal layer 23, a fourth metal layer 24, and a fifth metal layer 25. Dummy metals 3 corresponding to the second metal layer 22, the third metal layer 23, the fourth metal layer 24, and the fifth metal layer 25 under the inductor device 1 are arranged in a staggered manner. Some dummy metals 3 in the first metal layer 21 in which the inductor device 1 is located are arranged in a staggered manner with the dummy metals 3 corresponding to the metal layers (22, 23, 24, and 25) under the inductor device 1.

Figure 6:
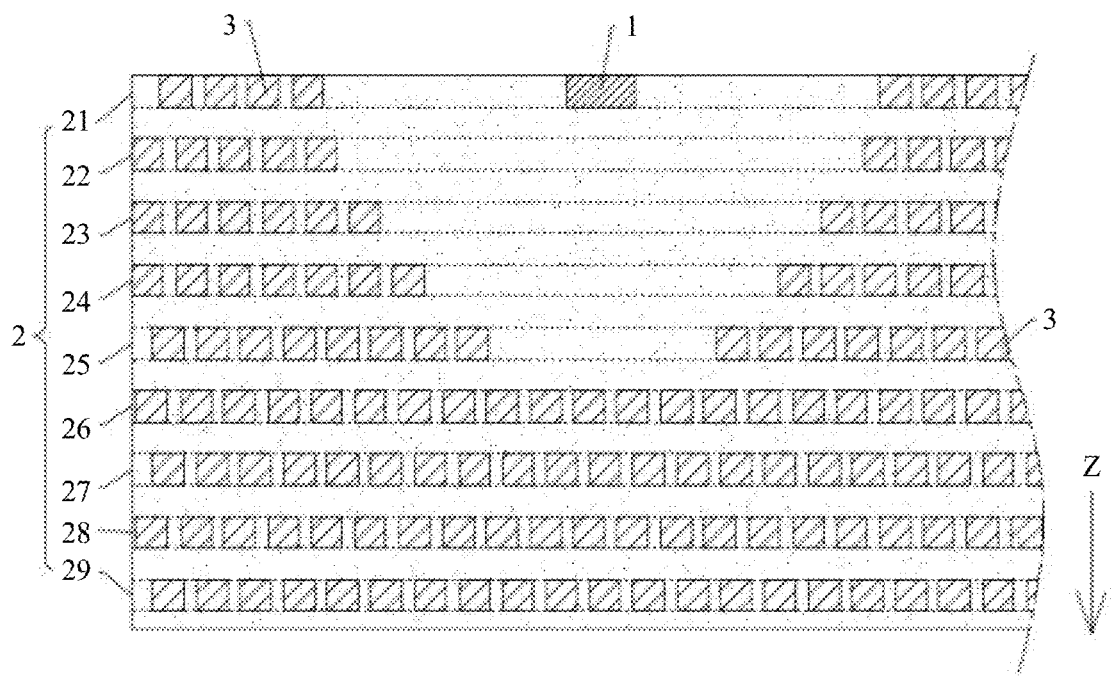
FIG. 6 is a diagram of a partial structure of an inductor device wiring architecture shown in FIG. 1 according to a third embodiment.

FIG. 6 is a diagram of a partial structure of the inductor device wiring architecture 10 shown in FIG. 1 according to a third embodiment. Most technical content in this embodiment is the same as that in the foregoing embodiments, and is not described in detail again.

In the third embodiment, the inductor device wiring architecture 10 includes a first metal layer 21 in which the inductor device 1 is located and a plurality of metal layers (a second metal layer 22 to a ninth metal layer 29) located under the inductor device 1. Arrangement areas of dummy metals 3 corresponding to the second metal layer 22 to the sixth metal layer 26 progressively increase in a Z direction away from the inductor device 1.

Under the inductor device 1, dummy metals 3 corresponding to one or more metal layers 2 are arranged in a staggered manner with dummy metals 3 corresponding to an adjacent metal layer 2, and dummy metals 3 corresponding to one or more metal layers 2 are arranged in alignment with dummy metals 3 corresponding to an adjacent metal layer 2. For example, dummy metals 3 corresponding to the second metal layer 22, dummy metals 3 corresponding to the third metal layer 23, and dummy metals 3 corresponding to the fourth metal layer 24 are arranged in alignment. In the fourth metal layer 24, the fifth metal layer 25, the sixth metal layer 26, the seventh metal layer 27, the eighth metal layer 28, and the ninth metal layer 29, dummy metals 3 corresponding to two adjacent metal layers 2 are arranged in a staggered manner. In this case, the plurality of dummy metals 3 located under the inductor device 1 in the inductor device wiring architecture 10 are arranged in a more diversified manner.

Some dummy metals 3 in the first metal layer 21 are arranged in a staggered manner with dummy metals 3 corresponding to the second metal layer 22. In another embodiment, some dummy metals 3 in the first metal layer 21 are arranged in alignment with dummy metals 3 corresponding to the second metal layer 22. An arrangement manner of the dummy metals 3 in the plurality of metal layers 2 in the inductor device wiring architecture 10 is not strictly limited in this application.

Further, in this application, there are a plurality of implementations of a relationship between arrangement areas of the dummy metals 3 corresponding to the plurality of metal layers 2 under the inductor device 1. Examples are as follows.

In an implementation, in the plurality of metal layers 2 under the inductor device 1, arrangement areas of dummy metals 3 corresponding to at least three adjacent metal layers 2 progressively increase in the Z direction away from the inductor device 1. In this case, the plurality of dummy metals 3 under the inductor device 1 present a continuous stepped shape. This helps further improve processing quality of the inductor device wiring architecture 10, and the plurality of dummy metals 3 under the inductor device 1 have less impact on performance of the inductor device 1.

In another implementation, an arrangement area of dummy metals 3 corresponding to an $i^{th}$ metal layer under the inductor device 1 is the same as an arrangement area of dummy metals 3 corresponding to an $(i-1)^{th}$ metal layer. The $i^{th}$ metal layer is located on a side of the (i-1)th metal layer that is away from the inductor device 1. In other words, the $i^{th}$ metal layer is located under the $(i-1)^{th}$ metal layer, and i is an integer greater than or equal to 2.

In this implementation, when the inductor device wiring architecture 10 roughly meets an arrangement rule of transitioning from a sparse arrangement to a dense arrangement, two metal layers 2 corresponding to dummy metals 3 with a same arrangement area are included under the inductor device 1, so that arrangement flexibility of the plurality of dummy metals 3 under the inductor device 1 in the inductor device wiring architecture 10 is higher, and arrangement manners are more diversified. The inductor device wiring architecture 10 may include one group of two metal layers 2 corresponding to dummy metals 3 with a same arrangement area, or may include more than two (including two) groups of two metal layers 2 corresponding to dummy metals 3 with a same arrangement area. Alternatively, the inductor device wiring architecture 10 may include more than three (including three) metal layers 2 corresponding to dummy metals 3 with a same arrangement area.

A plurality of dummy metals 3 corresponding to the $i^{th}$ metal layer are arranged at equal spacings, and an arrangement spacing between two adjacent dummy metals 3 is an $i^{th}$ spacing. A plurality of dummy metals 3 corresponding to the $(i-1)^{th}$ metal layer are arranged at equal spacings, and an arrangement spacing between two adjacent dummy metals 3 is an $(i-1)^{th}$ spacing. The $(i-1)^{th}$ spacing is less than or equal to the $i^{th}$ spacing. When the $(i-1)^{th}$ spacing is less than the $i^{th}$ spacing, although arrangement areas of the dummy metals 3 corresponding to the $i^{th}$ metal layer do not progressively increase, the plurality of dummy metals 3 in the $i^{th}$ metal layer have a larger arrangement range and a more uniform arrangement. This effectively improves processing quality of the metal layer 2, and achieves a higher product yield of the inductor device wiring architecture 10. Certainly, in another embodiment, an arrangement manner and an arrangement spacing of the plurality of dummy metals 3 corresponding to the $i^{th}$ metal layer and the $(i-1)^{th}$ metal layer may be alternatively different from those in the foregoing solution, and may be set as required.

In still another implementation, an arrangement area of dummy metals 3 corresponding to a $j^{th}$ metal layer under the inductor device 1 is smaller than an arrangement area of dummy metals 3 corresponding to a $(j-1)^{th}$ metal layer. The $j^{th}$ metal layer is located on a side of the $(j-1)^{th}$ metal layer that is away from the inductor device 1. In other words, the $j^{th}$ metal layer is located under the $(j-1)^{th}$ metal layer, and j is an integer greater than or equal to 2.

In this implementation, when the inductor device wiring architecture 10 roughly meets an arrangement rule of transitioning from a sparse arrangement to a dense arrangement, two metal layers 2 corresponding to dummy metals 3 are included under the inductor device 1, where an arrangement area of an upper metal layer is smaller than an arrangement area of a lower metal layer, so that arrangement flexibility of the plurality of dummy metals 3 under the inductor device 1 in the inductor device wiring architecture 10 is higher, and arrangement manners are more diversified. The inductor device wiring architecture 10 may include one group of two metal layers 2 corresponding to dummy metals 3, or may include more than two (including two) groups of two metal layers 2 corresponding to dummy metals 3, where an arrangement area of an upper metal layer is smaller than an arrangement area of a lower metal layer. Alternatively, the inductor device wiring architecture 10 may include more than three (including three) metal layers 2 corresponding to dummy metals 3, where an arrangement area of an upper metal layer is smaller than an arrangement area of a lower metal layer.

A plurality of dummy metals 3 corresponding to the $j^{th}$ metal layer are arranged at equal spacings, and an arrangement spacing between two adjacent dummy metals 3 is a $j^{th}$ spacing. A plurality of dummy metals 3 corresponding to the $(j-1)^{th}$ metal layer are arranged at equal spacings, and an arrangement spacing between two adjacent dummy metals 3 is a $(j-1)^{th}$ spacing. The $(j-1)^{th}$ spacing is less than or equal to the $j^{th}$ spacing. When the $(j-1)^{th}$ spacing is less than the $j^{th}$ spacing, the plurality of dummy metals 3 corresponding to the $j^{th}$ metal layer that corresponds to dummy metals 3 with a smaller arrangement area have a larger arrangement range and a more uniform arrangement. This effectively improves processing quality of the metal layer 2, and achieves a higher product yield of the inductor device wiring architecture 10. Certainly, in another embodiment, an arrangement manner and an arrangement spacing of the plurality of dummy metals 3 corresponding to the $j^{th}$ metal layer and the $(j-1)^{th}$ metal layer may be alternatively different from those in the foregoing solution, and may be set as required.

In other words, when arrangement areas of dummy metals 3 corresponding to at least two of the plurality of metal layers 2 under the inductor device 1 progressively increase in the direction away from the inductor device 1, an arrangement area of dummy metals 3 corresponding to one or more metal layers 2 and an arrangement area of dummy metals 3 corresponding to an adjacent metal layer 2 may be the same or progressively decrease (in the Z direction away from the inductor device 1). In this case, a higher product yield can also be achieved for the inductor device wiring architecture 10.

The foregoing three implementations may be used independently or in combination.

Examples are as follows

Refer to FIG. 3. In the first embodiment, the inductor device 1 is arranged in the first metal layer 21. Arrangement areas of dummy metals 3 corresponding to the second metal layer 22 and the third metal layer 23 under the inductor device 1 progressively increase in the direction away from the inductor device 1.

An arrangement area of dummy metals 3 corresponding to the fourth metal layer 24 (that is, a $3^{rd}$ metal layer under the inductor device 1) is the same as an arrangement area of dummy metals 3 corresponding to the third metal layer 23 (that is, a $2^{nd}$ metal layer under the inductor device 1). An arrangement area of dummy metals 3 corresponding to the fifth metal layer 25 (that is, a $4^{th}$ metal layer under the inductor device 1) is the same as the arrangement area of the dummy metals 3 corresponding to the fourth metal layer 24 (that is, the $3^{rd}$ metal layer under the inductor device 1). In other words, an arrangement area of dummy metals 3 corresponding to an $i^{th}$ metal layer under the inductor device 1 is the same as an arrangement area of dummy metals 3 corresponding to an $(i-1)^{th}$ metal layer. The $i^{th}$ metal layer is located on a side of the $(i-1)^{th}$ metal layer that is away from the inductor device 1, and i is an integer greater than or equal to 2.

A plurality of dummy metals 3 corresponding to the fourth metal layer 24 (that is, the $3^{rd}$ metal layer under the inductor device 1) are arranged at equal spacings, and an arrangement spacing between two adjacent dummy metals 3 is a third spacing. A plurality of dummy metals 3 corresponding to the third metal layer 23 (that is, the $2^{nd}$ metal layer under the inductor device 1) are arranged at equal spacings, and an arrangement spacing between two adjacent dummy metals 3 is a second spacing. The second spacing is equal to the third spacing. A plurality of dummy metals 3 corresponding to the fifth metal layer 25 (that is, the $4^{th}$ metal layer under the inductor device 1) are arranged at equal spacings, and an arrangement spacing between two adjacent dummy metals 3 is a fourth spacing. The fourth spacing is equal to the third spacing.

The arrangement area of the dummy metals 3 corresponding to the third metal layer 23 (that is, the $2^{nd}$ metal layer under the inductor device 1), the arrangement area of the dummy metals 3 corresponding to the fourth metal layer 24 (that is, the $3^{rd}$ metal layer under the inductor device 1), and the arrangement area of the dummy metals 3 corresponding to the fifth metal layer 25 (that is, the $4^{th}$ metal layer under the inductor device 1) are the same. In other words, more than three (including three) metal layers 2 under the inductor device 1 correspond to dummy metals 3 with a same arrangement area.

Refer to FIG. 5. In the second embodiment, the inductor device 1 is arranged in the first metal layer 21. The second metal layer 22 is disposed adjacent to the third metal layer 23 and the fourth metal layer 24 under the inductor device 1. In addition, arrangement areas of dummy metals 3 corresponding to the second metal layer 22, the third metal layer 23, and the fourth metal layer 24 progressively increase in the Z direction away from the inductor device 1. In other words, in the plurality of metal layers 2 under the inductor device 1, arrangement areas of dummy metals 3 corresponding to at least three adjacent metal layers 2 progressively increase in the Z direction away from the inductor device 1.

An arrangement area of dummy metals 3 corresponding to the fifth metal layer 25 (that is, a $4^{th}$ metal layer under the inductor device 1) is smaller than an arrangement area of dummy metals 3 corresponding to the fourth metal layer 24 (that is, a $3^{rd}$ metal layer under the inductor device 1). A plurality of dummy metals 3 corresponding to the fifth metal layer 25 (that is, the $4^{th}$ metal layer under the inductor device 1) are arranged at equal spacings, and an arrangement spacing between two adjacent dummy metals 3 is a fourth spacing. A plurality of dummy metals 3 corresponding to the fourth metal layer 24 (that is, the $3^{rd}$ metal layer under the inductor device 1) are arranged at equal spacings, and an arrangement spacing between two adjacent dummy metals 3 is a third spacing. The third spacing is equal to the fourth spacing.

Refer to FIG. 6. In the third embodiment, the inductor device 1 is arranged in the first metal layer 21. The second metal layer 22 is disposed adjacent to the third metal layer 23, the fourth metal layer 24, the fifth metal layer 25, and the sixth metal layer 26 under the inductor device 1. In addition, arrangement areas of dummy metals 3 corresponding to the second metal layer 22 to the sixth metal layer 26 progressively increase in the direction away from the inductor device 1.

Arrangement areas of dummy metals 3 corresponding to the sixth metal layer 26 (that is, a $5^{th}$ metal layer under the inductor device 1), the seventh metal layer 27 (that is, a $6^{th}$ metal layer under the inductor device 1), the eighth metal layer 28 (that is, a $7^{th}$ metal layer under the inductor device 1), and the ninth metal layer 29 (that is, an $8^{th}$ metal layer under the inductor device 1) are the same. In this case, more than three (including three) metal layers 2 under the inductor device 1 correspond to dummy metals 3 with a same arrangement area.

In the sixth metal layer 26 (that is, the $5^{th}$ metal layer under the inductor device 1), the seventh metal layer 27 (that is, the $6^{th}$ metal layer under the inductor device 1), the eighth metal layer 28 (that is, the $7^{th}$ metal layer under the inductor device 1), and the ninth metal layer 29 (that is, the $8^{th}$ metal layer under the inductor device 1), each metal layer 2 corresponds to a plurality of dummy metals 3, and an arrangement spacing between two adjacent dummy metals 3 remains the same in different metal layers 2. In another embodiment, an arrangement spacing between two adjacent dummy metals 3 may alternatively vary in different metal layers 2.

Figure 7:
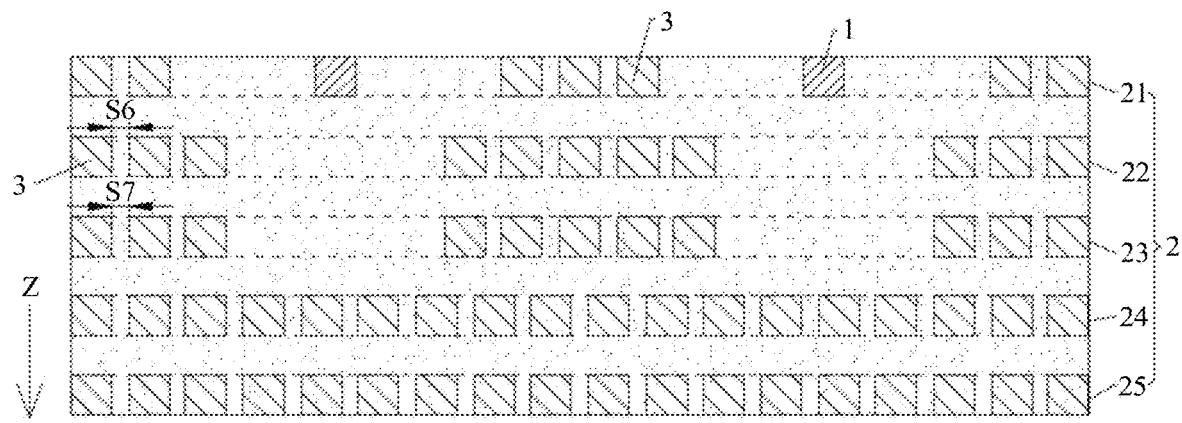
FIG. 7 is a diagram of a partial structure of an inductor device wiring architecture shown in FIG. 1 according to a fourth embodiment.

FIG. 7 is a diagram of the inductor device wiring architecture 10 shown in FIG. 1 according to a fourth embodiment. Most technical content in this embodiment is the same as that in the foregoing embodiments, and is not described in detail again.

In the fourth embodiment, the inductor device 1 is arranged in a first metal layer 21. Arrangement areas of dummy metals 3 corresponding to a third metal layer 23 and a fourth metal layer 24 under the inductor device 1 progressively increase in a Z direction away from the inductor device 1.

A second metal layer 22 and the fourth metal layer 24 are spaced from each other. Arrangement areas of dummy metals 3 corresponding to the second metal layer 22 and the fourth metal layer 24 progressively increase in the Z direction away from the inductor device 1.

An arrangement area of dummy metals 3 corresponding to the third metal layer 23 (that is, a $2^{nd}$ metal layer under the inductor device 1) is the same as an arrangement area of dummy metals 3 corresponding to the second metal layer 22 (that is, a $1^{st}$ metal layer under the inductor device 1). An arrangement area of dummy metals 3 corresponding to a fifth metal layer 25 (that is, a $4^{th}$ metal layer under the inductor device 1) is the same as an arrangement area of dummy metals 3 corresponding to the fourth metal layer 24 (that is, a $3^{rd}$ metal layer under the inductor device 1). In this case, two or more groups of two metal layers 2 corresponding to dummy metals 3 with a same arrangement area may be included under the inductor device 1.

An arrangement spacing between two adjacent dummy metals 3 in a plurality of dummy metals 3 corresponding to the third metal layer 23 (that is, the $2^{nd}$ metal layer under the inductor device 1) is a second spacing S7. An arrangement spacing between two adjacent dummy metals 3 in a plurality of dummy metals 3 corresponding to the second metal layer 22 (that is, the 1$^{st}$ metal layer under the inductor device 1) is a first spacing S6. The first spacing S6 is equal to the second spacing S7.

An arrangement spacing between two adjacent dummy metals 3 in a plurality of dummy metals 3 corresponding to the fifth metal layer 25 (that is, the 4$^{th}$ metal layer under the inductor device 1) is a fourth spacing. An arrangement spacing between two adjacent dummy metals 3 in a plurality of dummy metals 3 corresponding to the fourth metal layer 24 (that is, the 3$^{rd}$ metal layer under the inductor device 1) is a third spacing. The third spacing is equal to the fourth spacing. The third spacing may be equal to or not equal to the second spacing.

Figure 8:
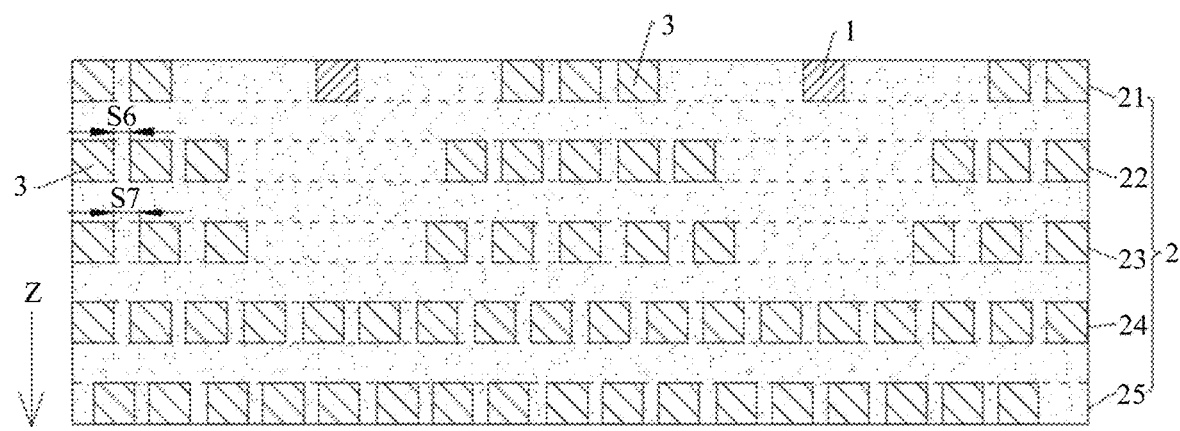
FIG. 8 is a diagram of an inductor device wiring architecture shown in FIG. 1 according to a fifth embodiment.

FIG. 8 is a diagram of the inductor device wiring architecture 10 shown in FIG. 1 according to a fifth embodiment. Most technical content in this embodiment is the same as that in the foregoing embodiments, and is not described in detail again.

In the fifth embodiment, the inductor device 1 is arranged in a first metal layer 21. Arrangement areas of dummy metals 3 corresponding to a third metal layer 23 and a fourth metal layer 24 under the inductor device 1 progressively increase in a Z direction away from the inductor device 1.

An arrangement area of dummy metals 3 corresponding to the third metal layer 23 (that is, a 2$^{nd}$ metal layer under the inductor device 1) is the same as an arrangement area of dummy metals 3 corresponding to the second metal layer 22 (that is, a 1$^{st}$ metal layer under the inductor device 1). An arrangement spacing between two adjacent dummy metals 3 in a plurality of dummy metals 3 corresponding to the third metal layer 23 (that is, the 2$^{nd}$ metal layer under the inductor device 1) is a second spacing S7. An arrangement spacing between two adjacent dummy metals 3 in a plurality of dummy metals 3 corresponding to the second metal layer 22 (that is, the 1$^{st}$ metal layer under the inductor device 1) is a first spacing S6. The first spacing S6 is less than the second spacing S7.

An arrangement area of dummy metals 3 corresponding to the fifth metal layer 25 (that is, a 4$^{th}$ metal layer under the inductor device 1) is smaller than an arrangement area of dummy metals 3 corresponding to the fourth metal layer 24 (that is, a 3$^{rd}$ metal layer under the inductor device 1). A plurality of dummy metals 3 in a plurality of dummy metals 3 corresponding to the fifth metal layer 25 (that is, the 4$^{th}$ metal layer under the inductor device 1) are arranged at equal spacings, and an arrangement spacing between two adjacent dummy metals 3 is a fourth spacing. A plurality of dummy metals 3 corresponding to the fourth metal layer 24 (that is, the 3$^{rd}$ metal layer under the inductor device 1) are arranged at equal spacings, and an arrangement spacing between two adjacent dummy metals 3 is a third spacing. The third spacing is equal to the fourth spacing.

Figure 9:
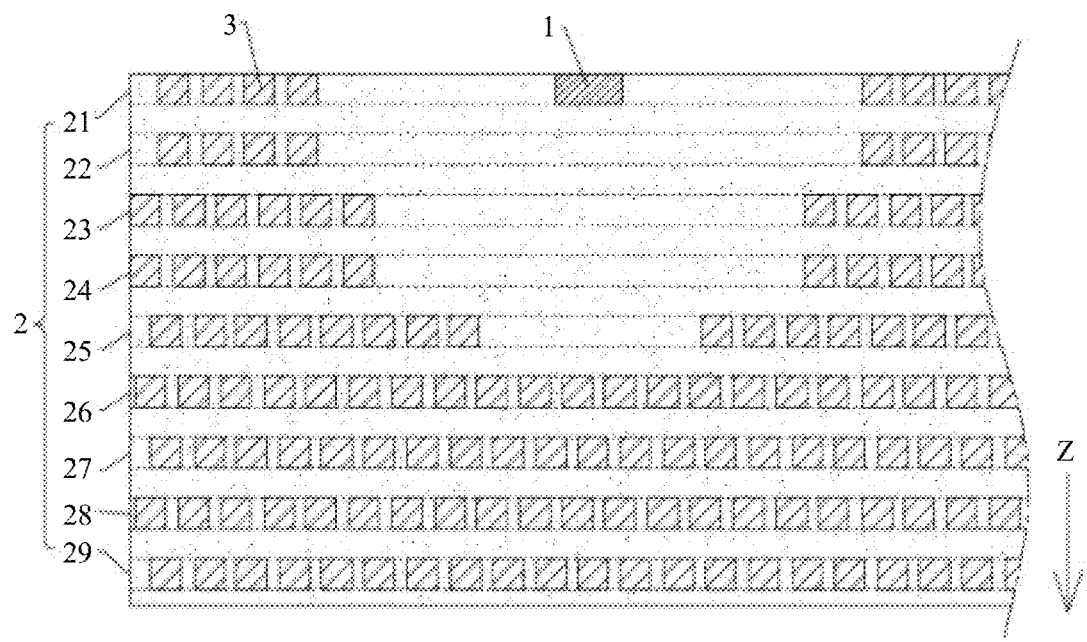
FIG. 9 is a diagram of a partial structure of an inductor device wiring architecture shown in FIG. 1 according to a sixth embodiment.

FIG. 9 is a diagram of a partial structure of the inductor device wiring architecture 10 shown in FIG. 1 according to a sixth embodiment. Most technical content in this embodiment is the same as that in the foregoing embodiments, and is not described in detail again.

In the sixth embodiment, the inductor device 1 is arranged in a first metal layer 21. Arrangement areas of dummy metals 3 corresponding to a second metal layer 22 and a third metal layer 23 under the inductor device 1 progressively increase in a direction away from the inductor device 1. Arrangement areas of dummy metals 3 corresponding to a fourth metal layer 24, a fifth metal layer 25, and a sixth metal layer 26 progressively increase in the direction away from the inductor device 1.

An arrangement area of dummy metals 3 corresponding to the fourth metal layer 24 (that is, a 3$^{rd}$ metal layer under the inductor device 1) is the same as an arrangement area of dummy metals 3 corresponding to the third metal layer 23 (that is, a 2$^{nd}$ metal layer under the inductor device 1). Arrangement areas of dummy metals 3 corresponding to the sixth metal layer 26 (that is, a 5$^{th}$ metal layer under the inductor device 1), a seventh metal layer 27 (that is, a 6$^{th}$ metal layer under the inductor device 1), an eighth metal layer 28 (that is, a 7$^{th}$ metal layer under the inductor device 1), and a ninth metal layer 29 (that is, an 8$^{th}$ metal layer under the inductor device 1) are the same.

Figure 10:
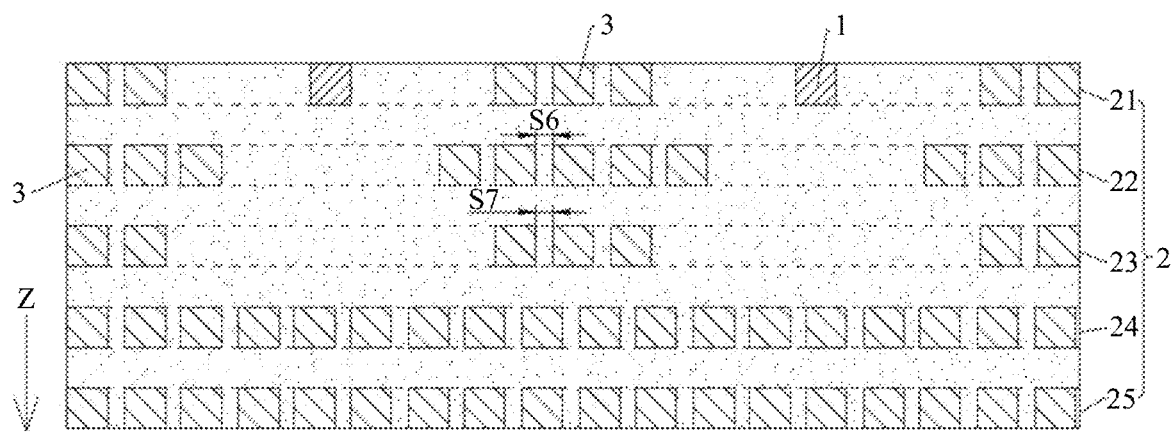
FIG. 10 is a diagram of an inductor device wiring architecture shown in FIG. 1 according to a seventh embodiment.

FIG. 10 is a diagram of the inductor device wiring architecture 10 shown in FIG. 1 according to a seventh embodiment. Most technical content in this embodiment is the same as that in the foregoing embodiments, and is not described in detail again.

In the seventh embodiment, the inductor device 1 is arranged in a first metal layer 21. Arrangement areas of dummy metals 3 corresponding to a third metal layer 23 and a fourth metal layer 24 under the inductor device 1 progressively increase in a direction away from the inductor device 1.

An arrangement area of dummy metals 3 corresponding to the third metal layer 23 (that is, a 2$^{nd}$ metal layer under the inductor device 1) is smaller than an arrangement area of dummy metals 3 corresponding to a second metal layer 22 (that is, a 1$^{st}$ metal layer under the inductor device 1). An arrangement spacing between two adjacent dummy metals 3 in a plurality of dummy metals 3 corresponding to the third metal layer 23 (that is, the 2$^{nd}$ metal layer under the inductor device 1) is a second spacing S7. An arrangement spacing between two adjacent dummy metals 3 in a plurality of dummy metals 3 corresponding to the second metal layer 22 (that is, the 1$^{st}$ metal layer under the inductor device 1) is a first spacing S6. The first spacing S6 is equal to the second spacing S7.

An arrangement area of dummy metals 3 corresponding to a fifth metal layer 25 (that is, a 4$^{th}$ metal layer under the inductor device 1) is the same as an arrangement area of dummy metals 3 corresponding to the fourth metal layer 24 (that is, a 3$^{rd}$ metal layer under the inductor device 1). An arrangement spacing between two adjacent dummy metals 3 in a plurality of dummy metals 3 corresponding to the fifth metal layer 25 (that is, the 4$^{th}$ metal layer under the inductor device 1) is equal to an arrangement spacing between two adjacent dummy metals 3 in a plurality of dummy metals 3 corresponding to the fourth metal layer 24 (that is, the 3$^{rd}$ metal layer under the inductor device 1).

Figure 11:
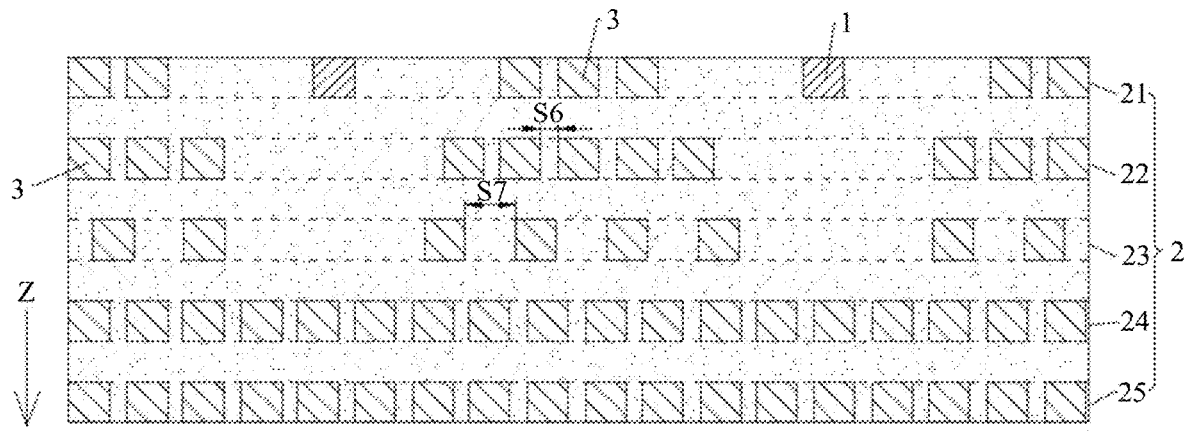
FIG. 11 is a structural diagram of an inductor device wiring architecture shown in FIG. 1 according to an eighth embodiment.

FIG. 11 is a diagram of the inductor device wiring architecture 10 shown in FIG. 1 according to an eighth embodiment. Most technical content in this embodiment is the same as that in the foregoing embodiments, and is not described in detail again.

In the eighth embodiment, the inductor device 1 is arranged in a first metal layer 21. Arrangement areas of dummy metals 3 corresponding to a third metal layer 23 and a fourth metal layer 24 under the inductor device 1 progressively increase in a direction away from the inductor device 1.

An arrangement area of dummy metals 3 corresponding to the third metal layer 23 (that is, a 2$^{nd}$ metal layer under the inductor device 1) is smaller than an arrangement area of dummy metals 3 corresponding to a second metal layer 22 (that is, a 1$^{st}$ metal layer under the inductor device 1).

An arrangement spacing between two adjacent dummy metals 3 in a plurality of dummy metals 3 corresponding to the third metal layer 23 (that is, the $2^{nd}$ metal layer under the inductor device 1) is a second spacing S7. An arrangement spacing between two adjacent dummy metals 3 in a plurality of dummy metals 3 corresponding to the second metal layer 22 (that is, the $1^{st}$ metal layer under the inductor device 1) is a first spacing S6. The first spacing S6 is less than the second spacing S7.

An arrangement area of dummy metals 3 corresponding to a fifth metal layer 25 (that is, a $4^{th}$ metal layer under the inductor device 1) is the same as an arrangement area of dummy metals 3 corresponding to the fourth metal layer 24 (that is, a $3^{rd}$ metal layer under the inductor device 1).

An arrangement spacing between two adjacent dummy metals 3 in a plurality of dummy metals 3 corresponding to the fifth metal layer 25 (that is, the $4^{th}$ metal layer under the inductor device 1) is equal to an arrangement spacing between two adjacent dummy metals 3 in a plurality of dummy metals 3 corresponding to the fourth metal layer 24 (that is, the $3^{rd}$ metal layer under the inductor device 1).

Figure 12:
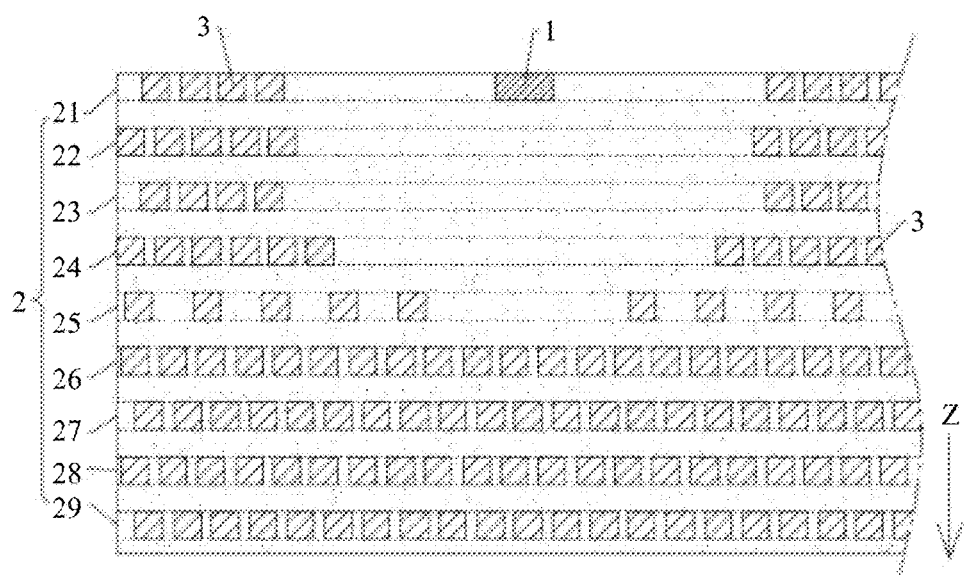
FIG. 12 is a diagram of a partial structure of an inductor device wiring architecture shown in FIG. 1 according to a ninth embodiment.

FIG. 12 is a diagram of a partial structure of the inductor device wiring architecture 10 shown in FIG. 1 according to a ninth embodiment. Most technical content in this embodiment is the same as that in the foregoing embodiments, and is not described in detail again.

In the ninth embodiment, the inductor device 1 is arranged in a first metal layer 21. Arrangement areas of dummy metals 3 corresponding to a third metal layer 23 and a fourth metal layer 24 under the inductor device 1 progressively increase in a direction away from the inductor device 1. Arrangement areas of dummy metals 3 corresponding to a fifth metal layer 25 and a sixth metal layer 26 progressively increase in the direction away from the inductor device 1.

An arrangement area of dummy metals 3 corresponding to the third metal layer 23 (that is, a $2^{nd}$ metal layer under the inductor device 1) is smaller than an arrangement area of dummy metals 3 corresponding to a second metal layer 22 (that is, a $1^{st}$ metal layer under the inductor device 1). An arrangement area of dummy metals 3 corresponding to the fifth metal layer 25 (that is, a $4^{th}$ metal layer under the inductor device 1) is smaller than an arrangement area of dummy metals 3 corresponding to the fourth metal layer 24 (that is, a $3^{rd}$ metal layer under the inductor device 1).

A plurality of dummy metals 3 in a plurality of dummy metals 3 corresponding to the third metal layer 23 (that is, the $2^{nd}$ metal layer under the inductor device 1) are arranged at equal spacings, and an arrangement spacing between two adjacent dummy metals 3 is a second spacing. A plurality of dummy metals 3 corresponding to the third metal layer 23 (that is, the $2^{nd}$ metal layer under the inductor device 1) are arranged at equal spacings, and an arrangement spacing between two adjacent dummy metals 3 is a first spacing. The first spacing is equal to the second spacing.

A plurality of dummy metals 3 corresponding to the fifth metal layer 25 (that is, the $4^{th}$ metal layer under the inductor device 1) are arranged at equal spacings, and an arrangement spacing between two adjacent dummy metals 3 is a fourth spacing. A plurality of dummy metals 3 corresponding to the fourth metal layer 24 (that is, the $3^{rd}$ metal layer under the inductor device 1) are arranged at equal spacings, and an arrangement spacing between two adjacent dummy metals 3 is a third spacing. The third spacing is equal to the fourth spacing.

Arrangement areas of dummy metals 3 corresponding to the sixth metal layer 26 (that is, a $5^{th}$ metal layer under the inductor device 1), a seventh metal layer 27 (that is, a $6^{th}$ metal layer under the inductor device 1), an eighth metal layer 28 (that is, a $7^{th}$ metal layer under the inductor device 1), and a ninth metal layer 29 (that is, an $8^{th}$ metal layer under the inductor device 1) are the same.

Figure 13:
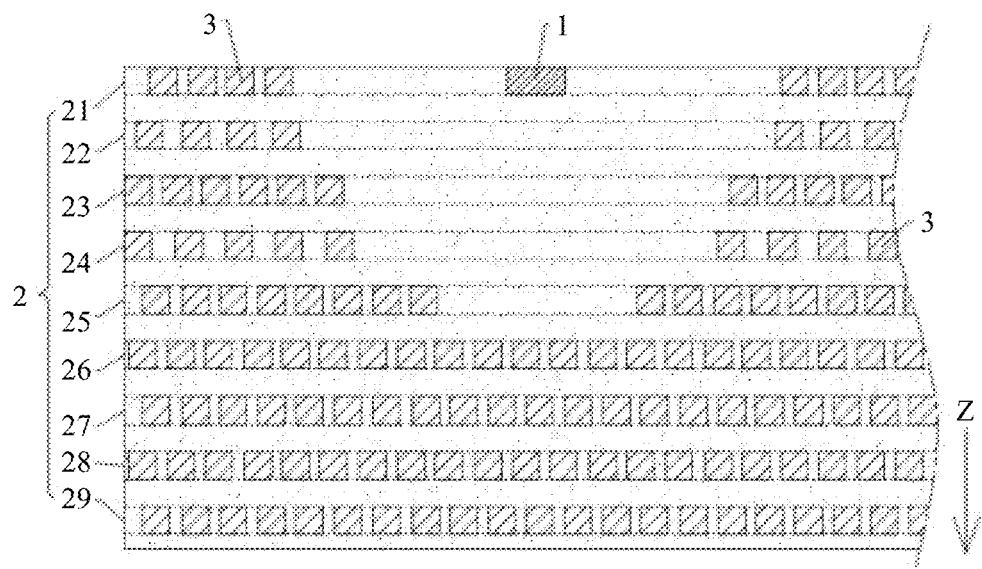
FIG. 13 is a diagram of a partial structure of an inductor device wiring architecture shown in FIG. 1 according to a tenth embodiment.

FIG. 13 is a diagram of a partial structure of the inductor device wiring architecture 10 shown in FIG. 1 according to a tenth embodiment. Most technical content in this embodiment is the same as that in the foregoing embodiments, and is not described in detail again.

In the tenth embodiment, the inductor device 1 is arranged in a first metal layer 21. Arrangement areas of dummy metals 3 corresponding to a second metal layer 22 and a third metal layer 23 under the inductor device 1 progressively increase in a direction away from the inductor device 1. A fourth metal layer 24 is disposed adjacent to a fifth metal layer 25, and a sixth metal layer 26. In addition, arrangement areas of dummy metals 3 corresponding to the fourth metal layer 24, the fifth metal layer 25, and the sixth metal layer 26 progressively increase in the direction away from the inductor device 1.

An arrangement area of dummy metals 3 corresponding to the second metal layer 22 (that is, a $1^{st}$ metal layer under the inductor device 1) is the same as an arrangement area of dummy metals 3 corresponding to the first metal layer 21 (that is, a metal layer in which the inductor device 1 is located). An arrangement spacing between two adjacent dummy metals in a plurality of dummy metals 3 corresponding to the second metal layer 22 (that is, the $1^{st}$ metal layer under the inductor device 1) is greater than an arrangement spacing between two adjacent dummy metals in a plurality of dummy metals 3 corresponding to the first metal layer 21 (that is, the metal layer in which the inductor device 1 is located).

An arrangement area of dummy metals 3 corresponding to the fourth metal layer 24 (that is, a $3^{rd}$ metal layer under the inductor device 1) is smaller than an arrangement area of dummy metals 3 corresponding to the third metal layer 24 (that is, a $2^{nd}$ metal layer under the inductor device 1). A plurality of dummy metals 3 corresponding to the fourth metal layer 24 (that is, the $3^{rd}$ metal layer under the inductor device 1) are arranged at equal spacings, and an arrangement spacing between two adjacent dummy metals 3 is a third spacing. A plurality of dummy metals 3 corresponding to the third metal layer 24 (that is, the $2^{nd}$ metal layer under the inductor device 1) are arranged at equal spacings, and an arrangement spacing between two adjacent dummy metals 3 is a second spacing. The second spacing is less than the third spacing.

Arrangement areas of dummy metals 3 corresponding to the sixth metal layer 26 (that is, a $5^{th}$ metal layer under the inductor device 1), a seventh metal layer 27 (that is, a $6^{th}$ metal layer under the inductor device 1), an eighth metal layer 28 (that is, a $7^{th}$ metal layer under the inductor device 1), and a ninth metal layer 29 (that is, an $8^{th}$ metal layer under the inductor device 1) are the same. In this application, the first embodiment to the tenth embodiment schematically describe an arrangement relationship of the plurality of dummy metals 3 under the inductor device 1, but do not strictly limit the arrangement relationship of the plurality of dummy metals 3 under the inductor device 1 (for example, a relationship between arrangement spacings in a single metal layer 2 and an arrangement spacing between a plurality of metal layers 2). For example, in the first embodiment to the tenth embodiment, the plurality of dummy metals 3 in the metal layers 2 under the inductor device 1 may be alternatively arranged randomly or according to another arrangement rule.

Further, in this application, the inductor device 1 may have a plurality of implementation structures. For example, the inductor device 1 may be an inductor with two ports or a transformer (transformer) with four ports. The inductor device 1 may be arranged in one metal layer; or the inductor device 1 may include an upper inductor and a lower inductor, and the upper inductor and the lower inductor are arranged in two adjacent metal layers.

In an implementation structure, as shown in FIG. 2, the inductor device 1 in the inductor device wiring architecture 10 is an inductor with two ports.

Figure 14:
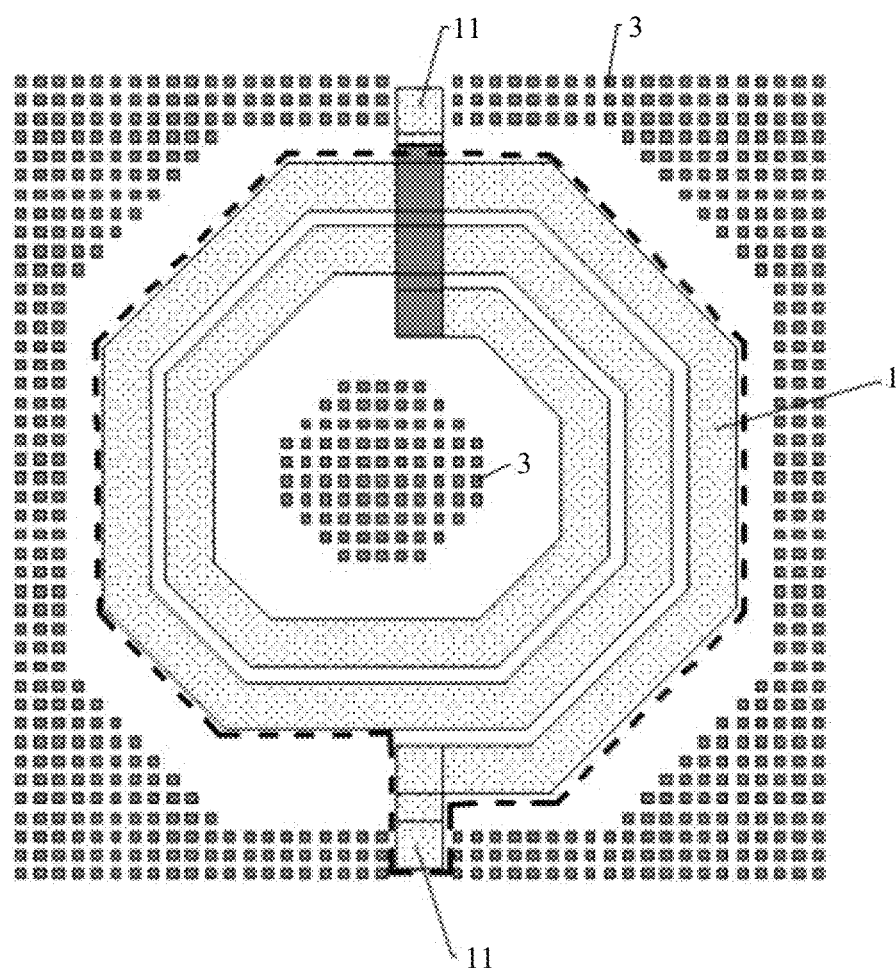
FIG. 14 shows an implementation structure of an inductor device in an inductor device wiring architecture shown in FIG. 1.

FIG. 14 shows an implementation structure of the inductor device 1 in the inductor device wiring architecture 10 shown in FIG. 1. FIG. 14 is a top view of a metal layer in which the inductor device 1 of the inductor device wiring architecture 10 is located.

In another implementation structure, the inductor device 1 in the inductor device wiring architecture 10 is a helical inductor with two ports. The helical inductor is arranged in one metal layer. 180° is formed between the two ports 11 of the helical inductor. A main structure of the helical inductor is arranged in one metal layer. The metal layer in which the inductor device 1 is located further includes a plurality of dummy metals 3. Some dummy metals 3 are arranged around a periphery of the helical inductor. Some dummy metals 3 are arranged in a middle space surrounded by the helical inductor. In FIG. 14, a wiring region of the inductor device 1 is schematically indicated by a dashed-line box on a periphery of the inductor device 1.

Figure 15:
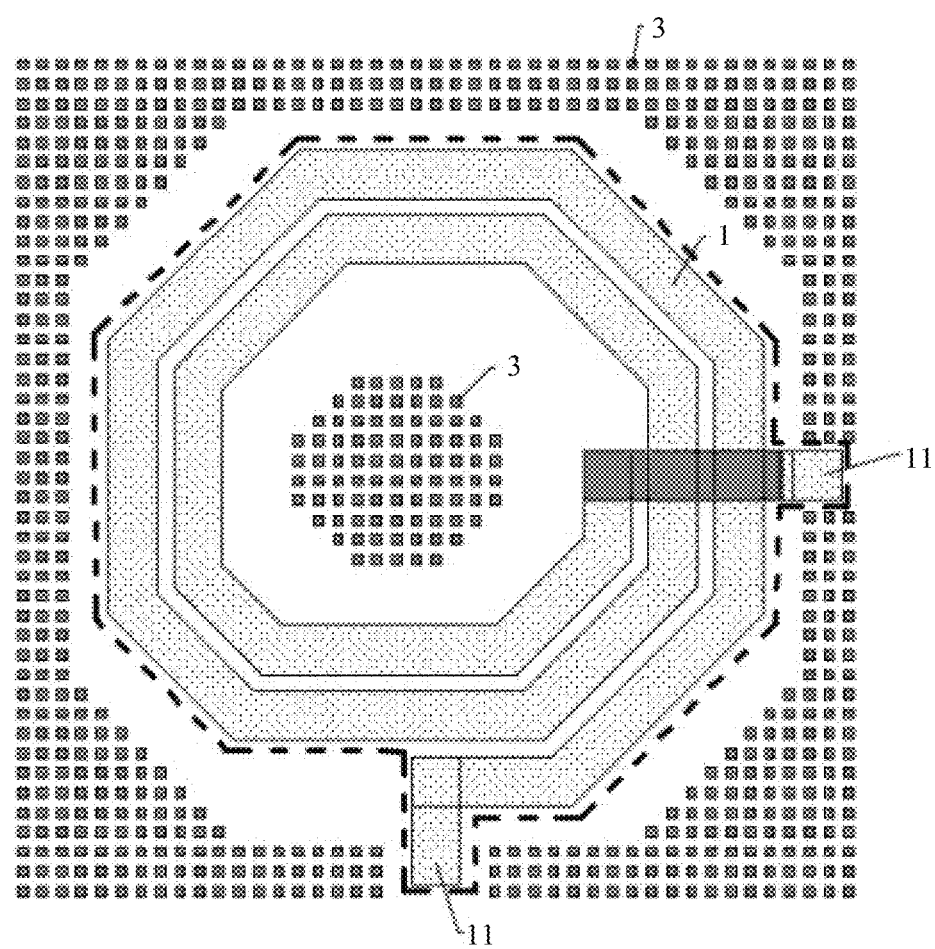
FIG. 15 shows another implementation structure of an inductor device in an inductor device wiring architecture shown in FIG. 1.

FIG. 15 shows another implementation structure of the inductor device 1 in the inductor device wiring architecture 10 shown in FIG. 1. FIG. 15 is a top view of a metal layer in which the inductor device 1 of the inductor device wiring architecture 10 is located.

In still another implementation structure, the inductor device 1 in the inductor device wiring architecture 10 is a helical inductor with two ports. 90° is formed between the two ports 11 of the helical inductor. A main structure of the helical inductor is arranged in one metal layer. The metal layer in which the inductor device 1 is located further includes a plurality of dummy metals 3. Some dummy metals 3 are arranged around a periphery of the helical inductor. Some dummy metals 3 are arranged in a middle space surrounded by the helical inductor. In FIG. 15, a wiring region of the inductor device 1 is schematically indicated by a dashed-line box on a periphery of the inductor device 1.

Figure 16:
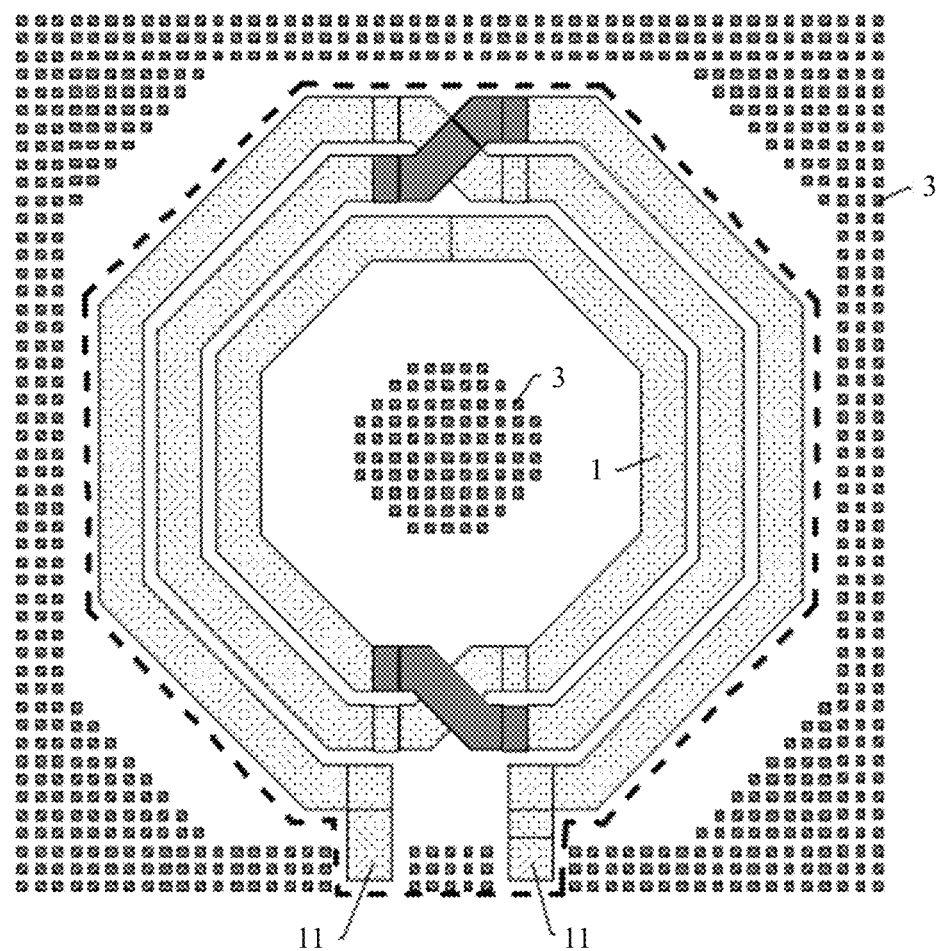
FIG. 16 shows still another implementation structure of an inductor device in an inductor device wiring architecture shown in FIG. 1.

FIG. 16 shows still another implementation structure of the inductor device 1 in the inductor device wiring architecture 10 shown in FIG. 1. FIG. 16 is a top view of a metal layer in which the inductor device 1 of the inductor device wiring architecture 10 is located.

In still another implementation structure, the inductor device 1 in the inductor device wiring architecture 10 is a differential inductor with two ports. A main structure of the differential inductor is arranged in one metal layer. The metal layer in which the inductor device 1 is located further includes a plurality of dummy metals 3. Some dummy metals 3 are arranged around a periphery of the differential inductor. Some dummy metals 3 are arranged in a middle space surrounded by the differential inductor. In FIG. 16, a wiring region of the inductor device 1 is schematically indicated by a dashed-line box on a periphery of the inductor device 1.

Figure 17:
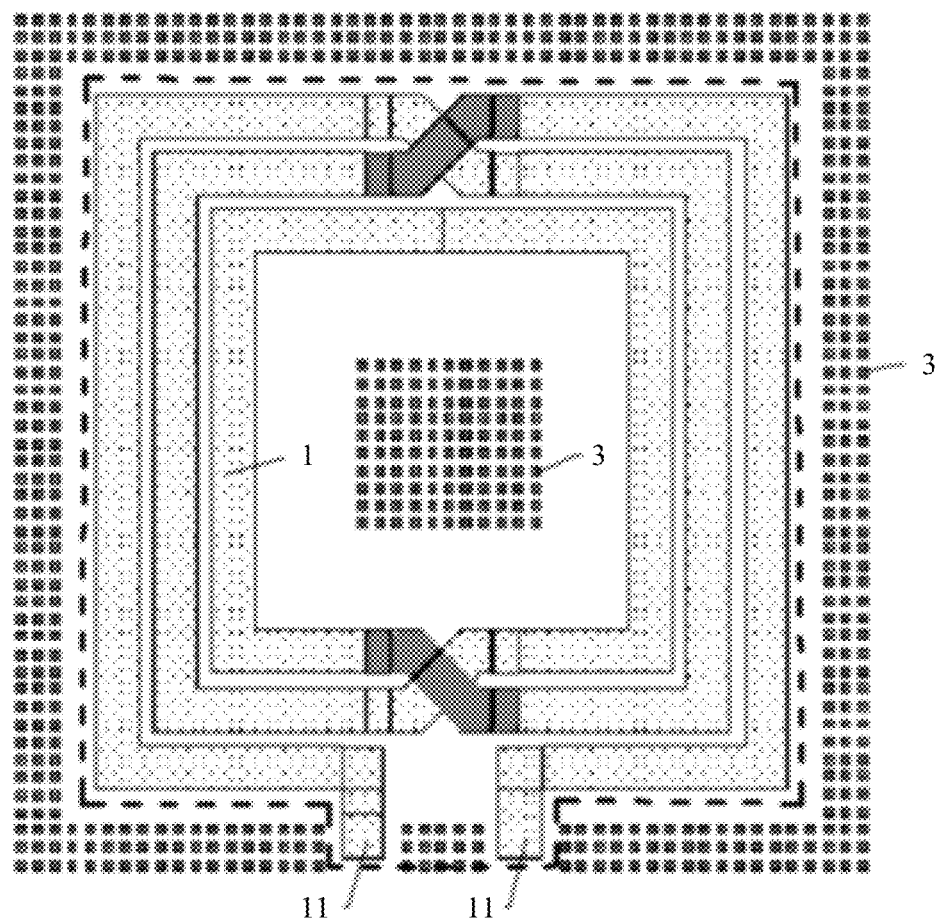
FIG. 17 shows still another implementation structure of an inductor device in an inductor device wiring architecture shown in FIG. 1.

FIG. 17 shows still another implementation structure of the inductor device 1 in the inductor device wiring architecture 10 shown in FIG. 1. FIG. 17 is a top view of a metal layer in which the inductor device 1 of the inductor device wiring architecture 10 is located.

In still another implementation structure, the inductor device 1 in the inductor device wiring architecture 10 is a square inductor with two ports. A main structure of the square inductor is arranged in one metal layer. The metal layer in which the inductor device 1 is located further includes a plurality of dummy metals 3. Some dummy metals 3 are arranged around a periphery of the square inductor. Some dummy metals 3 are arranged in a middle space surrounded by the square inductor. In FIG. 17, a wiring region of the inductor device 1 is schematically indicated by a dashed-line box on a periphery of the inductor device 1.

In this implementation structure, the square inductor is a differential inductor. In another implementation structure, the square inductor may be alternatively another inductor. In another implementation structure, the inductor may alternatively be an inductor in another shape, for example, a circular shape or a polygonal shape. This is not strictly limited in this application.

Figure 18:
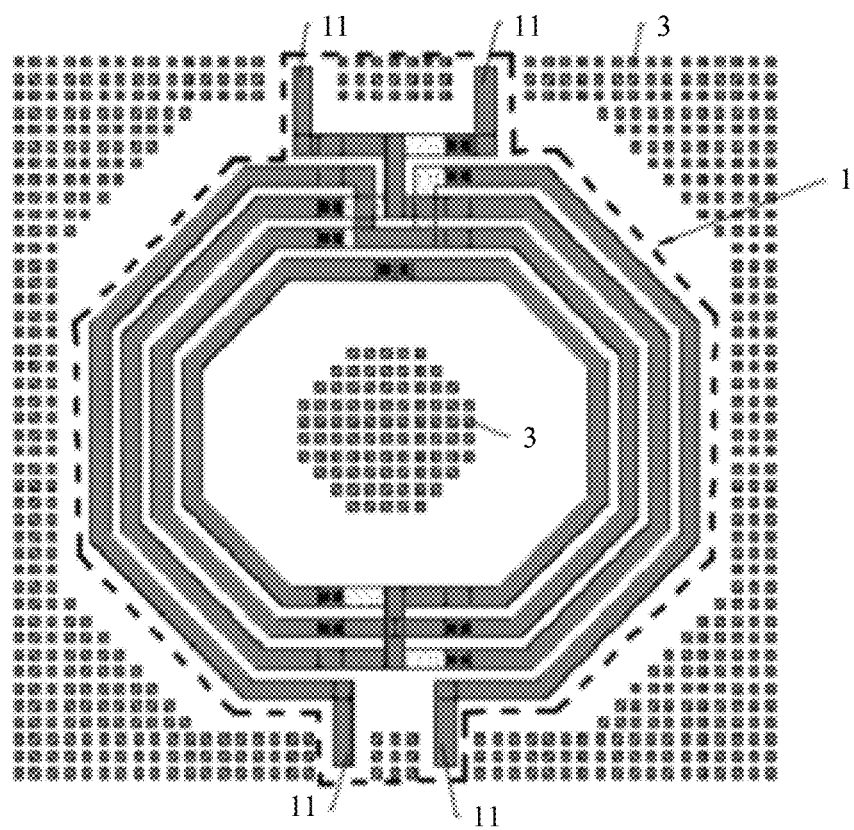
FIG. 18 shows still another implementation structure of an inductor device in an inductor device wiring architecture shown in FIG. 1.

FIG. 18 shows still another implementation structure of the inductor device 1 in the inductor device wiring architecture 10 shown in FIG. 1. FIG. 18 is a top view of a metal layer in which the inductor device 1 of the inductor device wiring architecture 10 is located.

In still another implementation structure, the inductor device 1 in the inductor device wiring architecture 10 is a transformer with four ports. The transformer includes two coils that are intertwined. Each coil has two ports 11. A main structure of the transformer is arranged in one metal layer. The metal layer in which the inductor device 1 is located further includes a plurality of dummy metals 3. Some dummy metals 3 are arranged around a periphery of the transformer. Some dummy metals 3 are arranged in a middle space surrounded by the transformer. In FIG. 18, a wiring region of the inductor device 1 is schematically indicated by a dashed-line box on a periphery of the inductor device 1.

Figure 19:
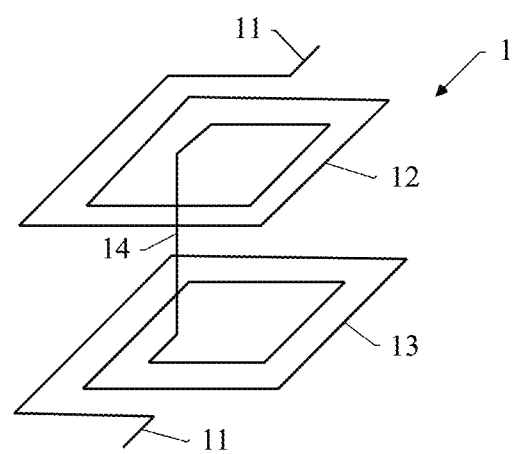
FIG. 19 shows still another implementation structure of an inductor device in an inductor device wiring architecture shown in FIG. 1.

FIG. 19 shows still another implementation structure of the inductor device 1 in the inductor device wiring architecture 10 shown in FIG. 1. FIG. 19 is a schematic three-dimensional structural diagram of the inductor device 1.

In still another implementation structure, the inductor device 1 may include an upper inductor 12 and a lower inductor 13. The upper inductor 12 and the lower inductor 13 are arranged in two adjacent metal layers. The upper inductor 12 and the lower inductor 13 may be connected by using a conductive material 14 in a via, so that the inductor device 1 serves as a multilayer metal serial (serial) inductor.

In this implementation structure, the wiring region of the inductor device 1 includes a region surrounded by an outer edge of an outermost wire of the upper inductor 12 and a region surrounded by an outer edge of an outermost wire of the lower inductor 13.

It can be understood that the plurality of implementation structures of the inductor device 1 are all used in the inductor device wiring architecture 10 shown in the first embodiment to the tenth embodiment.

In this application, the inductor device 1 in the inductor device wiring architecture 10 may be alternatively replaced with another transmission wire to form a transmission wire wiring architecture. The transmission wire may be used to transmit a signal with a frequency higher than 100 megahertz. For example, the transmission wire may be a key signal wire used to transmit a radio frequency signal.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

I claim:

1. An inductor device wiring architecture, comprising:
   an inductor device; and
   a plurality of dummy metals located under the inductor device, the plurality of dummy metals are arranged in a plurality of metal layers, each metal layer of the plurality of metal layers corresponds to one or more dummy metals of the plurality of dummy metals, and arrangement areas of dummy metals corresponding to at least three of the plurality of metal layers progressively increase in a direction away from the inductor device.

2. The inductor device wiring architecture according to claim 1, wherein the plurality of dummy metals are arranged in a stepped shape.

3. The inductor device wiring architecture according to claim 1, wherein an arrangement area of dummy metals corresponding to an $i^{th}$ metal layer under the inductor device is the same as an arrangement area of dummy metals corresponding to an $(i-1)^{th}$ metal layer, the $i^{th}$ metal layer is located on a side of the $(i-1)^{th}$ metal layer that is away from the inductor device, and i is an integer greater than or equal to 2.

4. The inductor device wiring architecture according to claim 3, wherein a plurality of dummy metals corresponding to the $i^{th}$ metal layer are arranged at equal spacings, an arrangement spacing between two adjacent dummy metals in the $i^{th}$ metal layer is an S7 spacing, a plurality of dummy metals corresponding to the $(i-1)^{th}$ metal layer are arranged at equal spacings, an arrangement spacing between two adjacent dummy metals in the $(I-1)^{th}$ metal layer is an S6 spacing, and the S6 spacing is less than the S7 spacing.

5. The inductor device wiring architecture according to claim 1, wherein an arrangement area of dummy metals corresponding to a $j^{th}$ metal layer under the inductor device is smaller than an arrangement area of dummy metals corresponding to a $(j-1)^{th}$ metal layer, the $j^{th}$ metal layer is located on a side of the $(j-1)^{th}$ metal layer that is away from the inductor device, and j is an integer greater than or equal to 2.

6. The inductor device wiring architecture according to claim 5, wherein a plurality of dummy metals corresponding to the $j^{th}$ metal layer are arranged at equal spacings, an arrangement spacing between two adjacent dummy metals in the $j^{th}$ metal layer is an S7 spacing, a plurality of dummy metals corresponding to the $(j-1)^{th}$ metal layer are arranged at equal spacings, an arrangement spacing between two adjacent dummy metals in the $(j-1)^{th}$ metal layer is a S6 spacing, and the S6 spacing is less than the S7 spacing.

7. The inductor device wiring architecture according to claim 1, wherein under the inductor device each metal layer corresponds to a plurality of dummy metals, and the dummy metals corresponding to the metal layer are arranged in a staggered manner with dummy metals corresponding to an adjacent metal layer.

8. The inductor device wiring architecture according to claim 1, wherein under the inductor device, each metal layer has a plurality of dummy metals, and the dummy metals corresponding to the metal layer are arranged in alignment with dummy metals corresponding to an adjacent metal layer.

9. The inductor device wiring architecture according to claim 1, wherein under the inductor device, each metal layer corresponds to a plurality of dummy metals, dummy metals corresponding to one or more metal layers are arranged in a staggered manner with dummy metals corresponding to an adjacent metal layer, and dummy metals corresponding to one or more metal layers are arranged in alignment with dummy metals corresponding to an adjacent metal layer.

10. The inductor device wiring architecture according to claim 1, wherein the inductor device is an inductor with two ports or a transformer with four ports.

11. The inductor device wiring architecture according to claim 1, wherein the inductor device is arranged in one metal layer; or the inductor device comprises an upper inductor and a lower inductor and the upper inductor and the lower inductor are arranged in two adjacent metal layers.

12. An integrated circuit, comprising an inductor device wiring architecture, comprising:
    an inductor device; and
    a plurality of dummy metals located under the inductor device, the plurality of dummy metals are arranged in a plurality of metal layers, each metal layer of the plurality of metal layers corresponds to one or more dummy metals of the plurality of dummy metals, and arrangement areas of dummy metals corresponding to at least three of the plurality of metal layers progressively increase in a direction away from the inductor device.

13. A communications device, comprising a radio frequency integrated circuit, comprising:
    an inductor device; and
    a plurality of dummy metals located under the inductor device, the plurality of dummy metals are arranged in a plurality of metal layers, each metal layer of the plurality of metal layers corresponds to one or more dummy metals of the plurality of dummy metals, and arrangement areas of dummy metals corresponding to at least three of the plurality of metal layers progressively increase in a direction away from the inductor device.

* * * * *